US010372177B2

(12) United States Patent
Kurosaki

(10) Patent No.: US 10,372,177 B2
(45) Date of Patent: Aug. 6, 2019

(54) INFORMATION PROCESSING APPARATUS

(71) Applicant: FUJITSU LIMITED, Kawasaki-shi, Kanagawa (JP)

(72) Inventor: Keitaro Kurosaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/896,136

(22) Filed: Feb. 14, 2018

(65) Prior Publication Data
US 2018/0260006 A1 Sep. 13, 2018

(30) Foreign Application Priority Data

Mar. 13, 2017 (JP) .................... 2017-047690

(51) Int. Cl.
*G06F 1/20* (2006.01)
*H05K 7/20* (2006.01)

(52) U.S. Cl.
CPC ........... *G06F 1/20* (2013.01); *H05K 7/20145* (2013.01); *H05K 7/20181* (2013.01)

(58) Field of Classification Search
CPC .. G06F 1/20; H05K 7/20145; H05K 7/20181; H05K 7/20727; H05K 7/20736; H05K 7/20709
USPC ....... 361/679.46, 679.48, 679.49, 679.5, 690
See application file for complete search history.

(56) References Cited

U.S. PATENT DOCUMENTS

| | | | | |
|---|---|---|---|---|
| 5,796,580 A * | 8/1998 | Komatsu | ............ | H05K 7/20727 361/679.47 |
| 6,975,510 B1 * | 12/2005 | Robbins | ............. | H05K 7/20563 312/223.2 |
| 7,042,722 B2 * | 5/2006 | Suzuki | ............... | H05K 7/20581 361/695 |
| 7,046,470 B2 * | 5/2006 | Yamanashi | ............... | G06F 1/20 360/69 |
| 7,352,571 B2 * | 4/2008 | Suzuki | ...................... | G06F 1/20 361/679.48 |
| 7,414,852 B1 * | 8/2008 | Otte | ..................... | H05K 7/1424 312/223.1 |
| 7,701,714 B2 * | 4/2010 | Shabany | ............ | H05K 7/20781 165/104.33 |
| 10,058,011 B2 * | 8/2018 | Graczyk | ............ | H05K 7/20736 |
| 2004/0008484 A1 * | 1/2004 | Konshak | ................. | G06F 1/184 361/679.5 |
| 2005/0286222 A1 * | 12/2005 | Lucero | ............... | H05K 7/20563 361/690 |
| 2008/0239656 A1 | 10/2008 | Sasagawa et al. | | |

(Continued)

FOREIGN PATENT DOCUMENTS

JP 2008-251067 10/2008

*Primary Examiner* — Anatoly Vortman
*Assistant Examiner* — Stephen S Sul
(74) *Attorney, Agent, or Firm* — Fujitsu Patent Center

(57) ABSTRACT

An information processing apparatus includes a housing that a slot where an electronic assembly is inserted and extracted and a power supply unit. A first air inlet is present in a corner in a front portion of the electronic assembly and includes a space to store an engaging mechanism that engages with the slot. A duct is arranged between the slot and the housing and includes a second air inlet in a front portion of the housing. A fan is arranged between the slot and the power supply unit. The first inlet communicates with the duct and, by the fan, air from the first air inlet and the second air inlet is sent to the power supply unit through the duct.

6 Claims, 27 Drawing Sheets

(56) References Cited

U.S. PATENT DOCUMENTS

| | | | |
|---|---|---|---|
| 2009/0016019 A1* | 1/2009 | Bandholz | G06F 1/20 361/695 |
| 2011/0161612 A1* | 6/2011 | Kurokawa | G06F 1/187 711/163 |
| 2011/0176271 A1* | 7/2011 | Zhang | G06F 1/20 361/679.33 |
| 2012/0201001 A1* | 8/2012 | Aoki | H05K 7/20727 361/690 |
| 2014/0071621 A1* | 3/2014 | Dong | H05K 7/20727 361/692 |
| 2014/0247552 A1* | 9/2014 | Petruzzo | G06F 1/20 361/679.51 |
| 2015/0036287 A1* | 2/2015 | Ross | G06F 1/20 361/679.48 |
| 2015/0070830 A1* | 3/2015 | Iwasaki | H05K 7/1487 361/679.33 |
| 2016/0128230 A1* | 5/2016 | Lam | H05K 7/20727 361/695 |
| 2017/0150621 A1* | 5/2017 | Breakstone | G06F 13/4022 |

* cited by examiner

FIG. 23
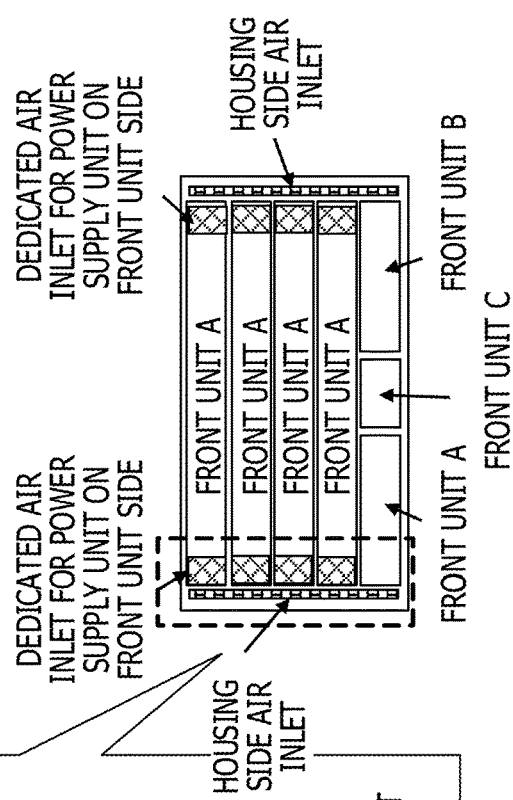
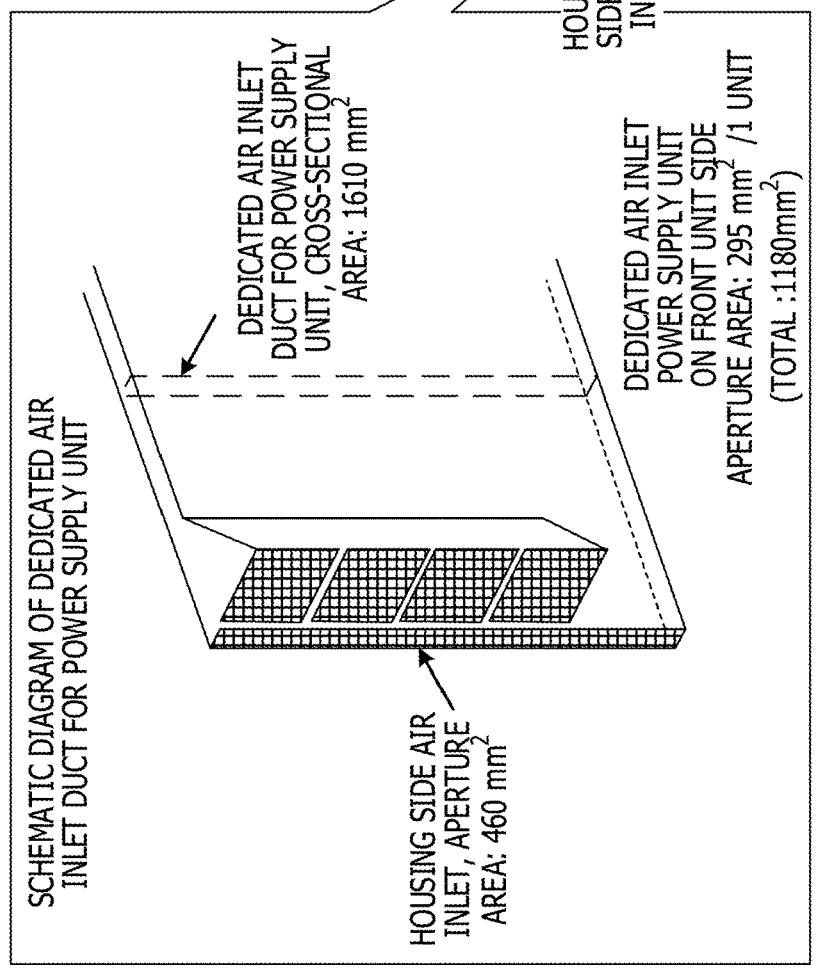

INFORMATION PROCESSING APPARATUS

CROSS-REFERENCE TO RELATED APPLICATION

This application is based upon and claims the benefit of priority of the prior Japanese Patent Application No. 2017-47690, filed on Mar. 13, 2017, the entire contents of which are incorporated herein by reference.

FIELD

The embodiments discussed herein are related to an information processing apparatus.

BACKGROUND

Information processing apparatuses are equipped with various cooling mechanisms.

Some information processing apparatuses have structures, in each of which a plurality of units are detachable and attachable in a single apparatus so as to adapt to advance and increase in functionality. In information processing apparatuses with such structures, for example, the front of a housing, where a unit is detached and attached, is regarded as the air inlet side while the rear of the housing is regarded as the air outlet side.

Performance of information processing apparatuses has been growing and the calorific values of installed electronic components have been increasing as well. In an information processing apparatus, therefore, it is desirable that not only integrated circuits, such as a central processing unit (CPU) and memory, but also a power supply unit and other electronic components be supplied with a sufficient amount of cold air. However, in an information processing apparatus in which the front of a housing, where a unit is detached and attached, is regarded as the air inlet side while the rear of the housing is regarded as the air outlet side, normally, air that has passed through a detachable and attachable unit flows to the rear face of the housing and thus, no low-temperature cooling wind is supplied to the electronic components located more downstream than the unit. To enable low-temperature cooling wind to be supplied to the electronic components located more downstream than the unit even in the information processing apparatus in which the front of the housing, where the unit is detached and attached, is regarded as the air inlet side while the rear of the housing is regarded as the air outlet side, for example, it is conceivable to arrange an air inlet duct that bypasses the unit. Arranging an air inlet duct that bypasses the unit enables low-temperature cooling wind to be supplied to the electronic components located further downstream than the unit. However, arranging an air inlet duct that bypasses the unit decreases space that the unit may occupy. Thus, in an information processing apparatus with a structure where an air inlet duct that bypasses a unit is arranged, the number or sizes of components that may be installed in the unit against the amount of the cooling wind that may be provided through the air inlet duct are traded off.

The following is a reference document.
[Document 1] Japanese Laid-open Patent Publication No. 2008-251067.

SUMMARY

According to an aspect of the invention, an information processing apparatus includes a heat generation device arranged behind a slot where an electronic assembly is inserted and extracted, an air inlet that is present in a corner in a front portion of the electronic assembly and includes a space to store an engaging mechanism that engages with the slot, and a duct that bypasses the electronic assembly from the air inlet and leads to the heat generation device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 23 illustrates air inlets formed by dedicated air inlets for the power supply unit and the housing side air inlets according to the implementation example and a passage on a downstream side thereof;

DESCRIPTION OF EMBODIMENTS

Embodiments are described hereinafter. The embodiments presented below are mere examples and are not intended to limit the technical scope of the present disclosure to the aspects below.

Figure 1:
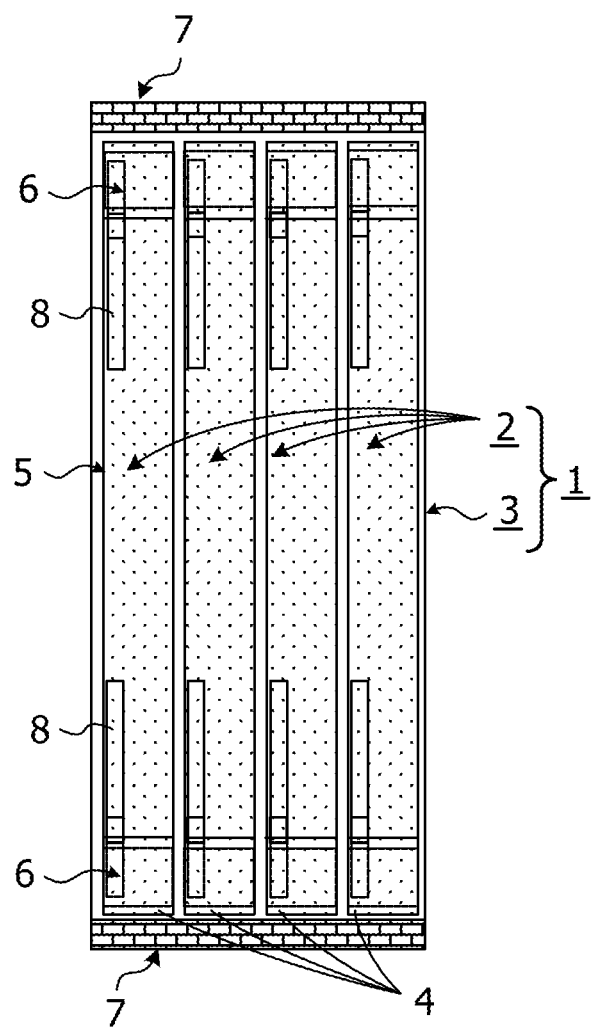
FIG. 1 illustrates an information processing apparatus according to an embodiment, which is viewed from the front.
Figure 2:
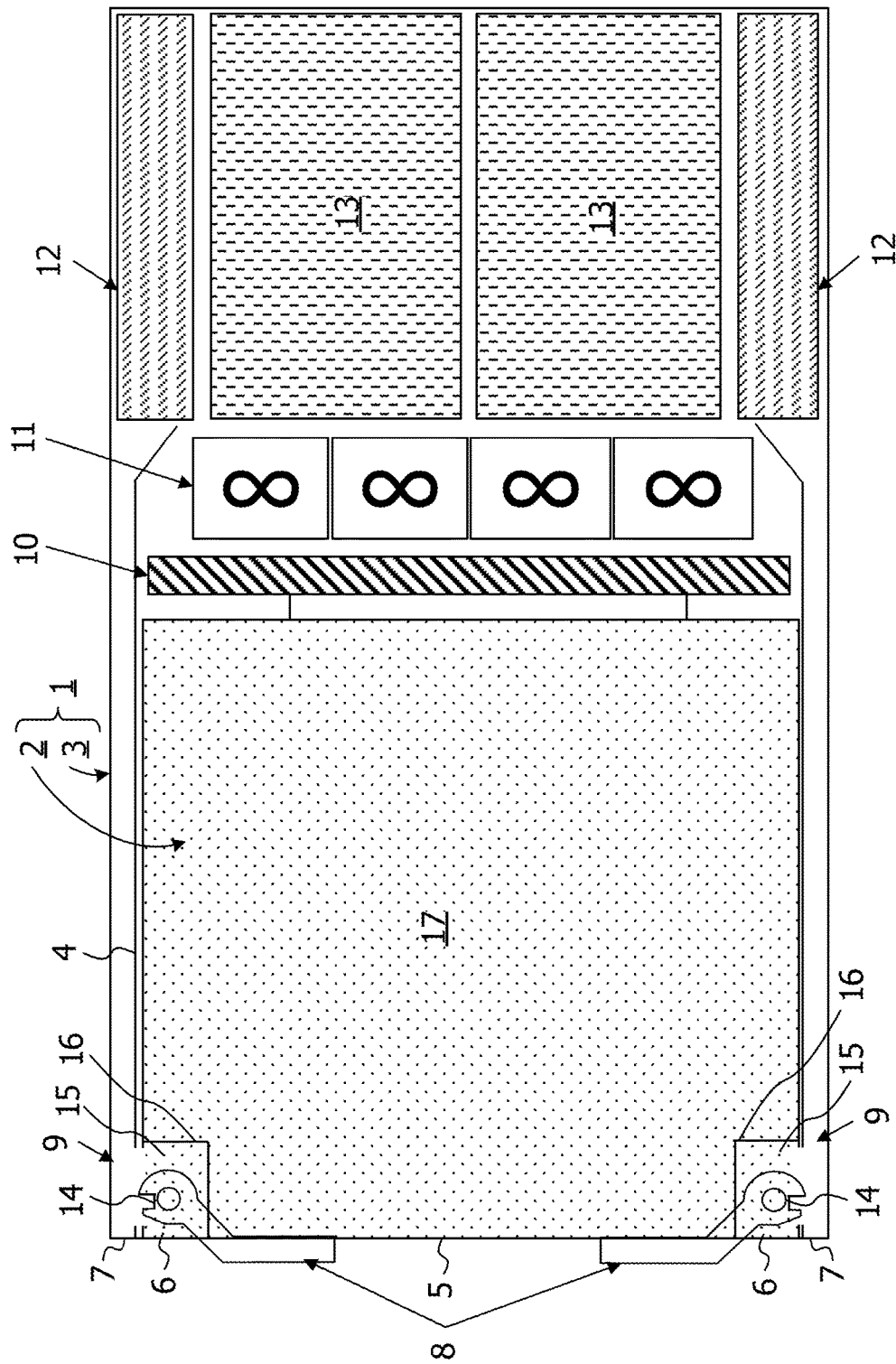
FIG. 2 illustrates an internal structure of the information processing apparatus according to the embodiment.

FIG. 1 illustrates an information processing apparatus 1 according to an embodiment, which is viewed from the front. FIG. 2 illustrates an internal structure of the information processing apparatus 1 according to the embodiment. The information processing apparatus 1 is an apparatus where various front units 2, which are selected according to specifications demanded by users, may be inserted and extracted so as to adapt to advance and increase in functionality. That is, the information processing apparatus 1 includes a housing 3 with a plurality of slots 4 where the front units 2 are inserted and extracted. Behind the slot 4, a mid-plane 10, where terminals of the front unit 2 are fitted, power supply units 12, which are examples of a "heat generation device" according to the present application and supply power to the front units 2, and rear units 13, which govern computation processing of various kinds together with the front unit 2, are arranged.

Each front unit 2 is a unit where integrated circuits, such as a central processing unit (CPU) and read only memory (ROM), and electronic components, such as a dual inline memory module (DIMM), a hard disk drive (HDD), a solid state drive (SSD), and a peripheral component interconnect (PCI) card, and the like are mounted. In the front unit 2, the engaging mechanisms 14 that engage with projections (blocks) in the slot 4 of the housing 3 are arranged in both corners in the front of the front unit 2. The engaging mechanisms 14 are stored in engaging mechanism storing spaces 15. The engaging mechanism 14 includes an eject lever 8 that projects further forward than the front unit 2 from the engaging mechanism storing space 15 so as to be synchronized with movement of the eject lever 8 operated by a worker. The engaging mechanism storing space 15 is a space partitioned from an electronic component storing space 17, which occupies the most part of the inside of the front unit 2, by a plate-like partition 16 that partitions the internal space of the front unit 2.

In the housing 3, fan units 11 are arranged so that the front of the housing 3 where the front units 2 are detached and attached serves as the air inlet side and the rear of the housing 3 serves as the air outlet side. In the front of the front unit 2, an air inlet 5 for the front unit is formed almost all over the region. Further, in corners in the front of the front unit 2, in other words, in portions corresponding to the engaging mechanism storing spaces 15, dedicated air inlets 6 for the power supply units are formed. The dedicated air inlets 6 for the power supply units are present in portions corresponding to the engaging mechanism storing spaces 15 and thus include the engaging mechanisms 14 inside when viewed from the front. Also on both sides of the slots 4 in the front of the housing 3, housing side air inlets 7 are formed. In both side portions of the slots 4 of the housing 3, dedicated air inlet ducts 9 for the power supply units are arranged, which extend along an insertion and extraction direction in which the front units 2 are inserted into and extracted from the slots 4. The housing side air inlets 7 are positioned on the upstream side of the dedicated air inlet ducts 9 for the power supply units. The air inlet 5 for the front unit, the dedicated air inlets 6 for the power supply units, and the housing side air inlets 7 are covered with meshes for fire protection, which may be punched metals for example, so as to comply with various standards demanded on the information processing apparatus 1, such as those according to the International Electrotechnical Commission (IEC).

In the aforementioned front unit 2, since the engaging mechanisms 14 engage with the projections in the slots 4, the engaging mechanism storing spaces 15 where the engaging mechanisms 14 are stored are not partitioned on the sides of the dedicated air inlet ducts 9 for the power supply units. That is, each engaging mechanism storing space 15 is open on the side of the dedicated air inlet duct 9 for the power supply unit. Consequently, in the information processing apparatus 1, flow of cooling wind is formed as described below.

Figure 3:
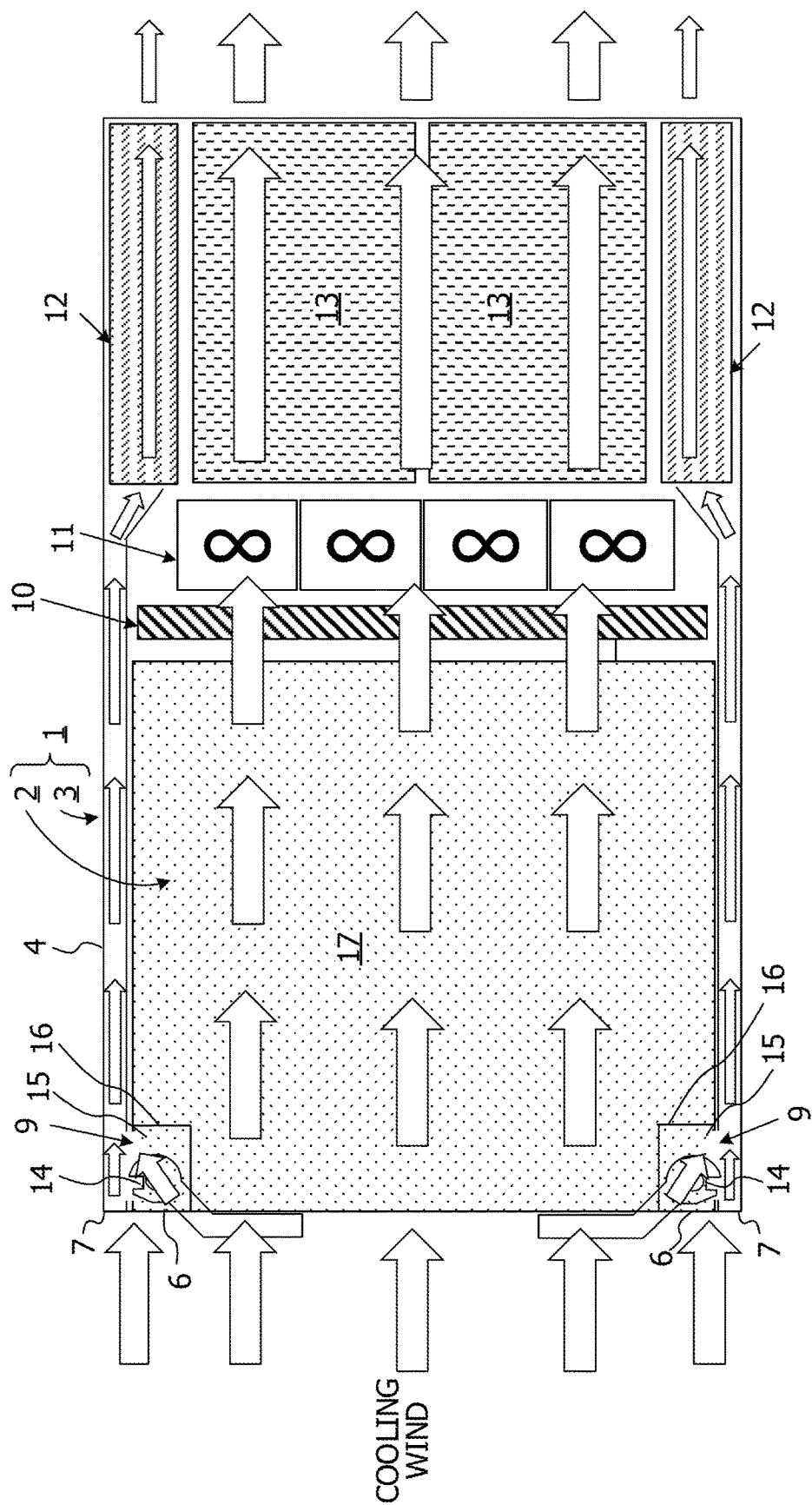
FIG. 3 illustrates flow of cooling wind in the information processing apparatus.

FIG. 3 illustrates flow of cooling wind in the information processing apparatus 1. When the fan units 11 arranged behind the slot 4 operate, air is taken in from the air inlet 5 for the front unit and passes through the electronic component storing space 17 to escape from the rear of the housing 3 through the rear unit 13. The air that is taken in from the housing side air inlet 7 as the fans of the power supply unit 12 operate merges with the air that is taken in from the dedicated air inlets 6 for the power supply units and passes through the engaging mechanism storing spaces 15 in the dedicated air inlet ducts 9 for the power supply units to flow to the power supply units 12. That is, the air that is taken in from the dedicated air inlets 6 for the power supply units and the housing side air inlets 7 bypass the front unit 2 and flows directly to the power supply units 12. As a result, air lower in temperature and fresher than the air that passes through the electronic component storing space 17 (fresh air) flows to the power supply units 12.

Since a mesh for fire protection is arranged for each housing side air inlet 7, the effective air inlet area of the housing side air inlet 7 is smaller than the cross-sectional area of a passage of the dedicated air inlet duct 9 for the power supply unit. However, a portion that functions as an air inlet of the dedicated air inlet duct 9 for the power supply unit is constituted of not only the housing side air inlet 7 but also the dedicated air inlet 6 for the power supply unit and thus, in the information processing apparatus 1 according to the present embodiment, an air inlet area equivalent to the cross-sectional area of the passage of the dedicated air inlet duct 9 for the power supply unit is ensured by the housing side air inlet 7 and the dedicated air inlet 6 for the power supply unit. As a result, the power supply unit 12 is supplied with air of an amount calculated from the cross-sectional area of the passage of the dedicated air inlet duct 9 for the power supply unit as cooling wind.

Consequently, in the information processing apparatus 1, compared to a case where the power supply units 12 are cooled using air that passes through the front unit 2, the power supply unit 12 larger in capacity may be employed. An implementation example corresponding to an example of the information processing apparatus 1 is prepared as below to verify advantages of the information processing apparatus 1 and the verification results are described hereinafter.

Implementation Example

Figure 4:
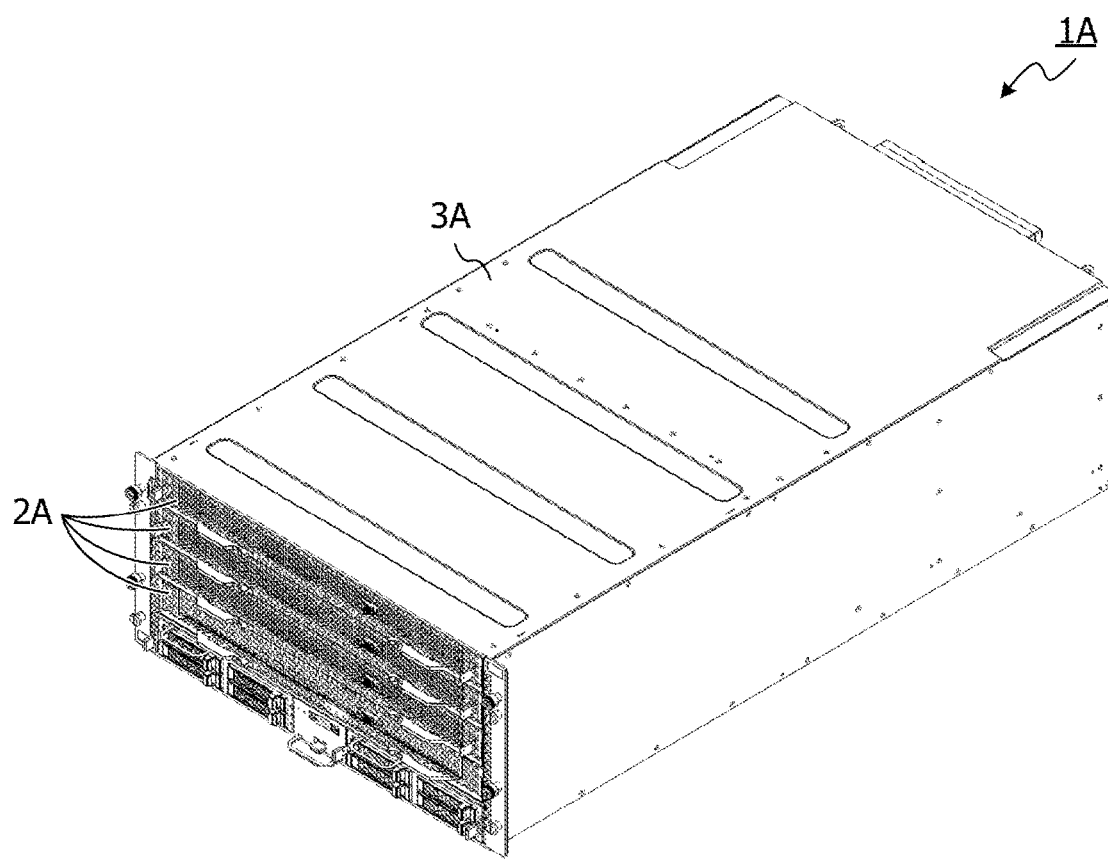
FIG. 4 is a perspective view that illustrates an information processing apparatus according to an implementation example.
Figure 5:
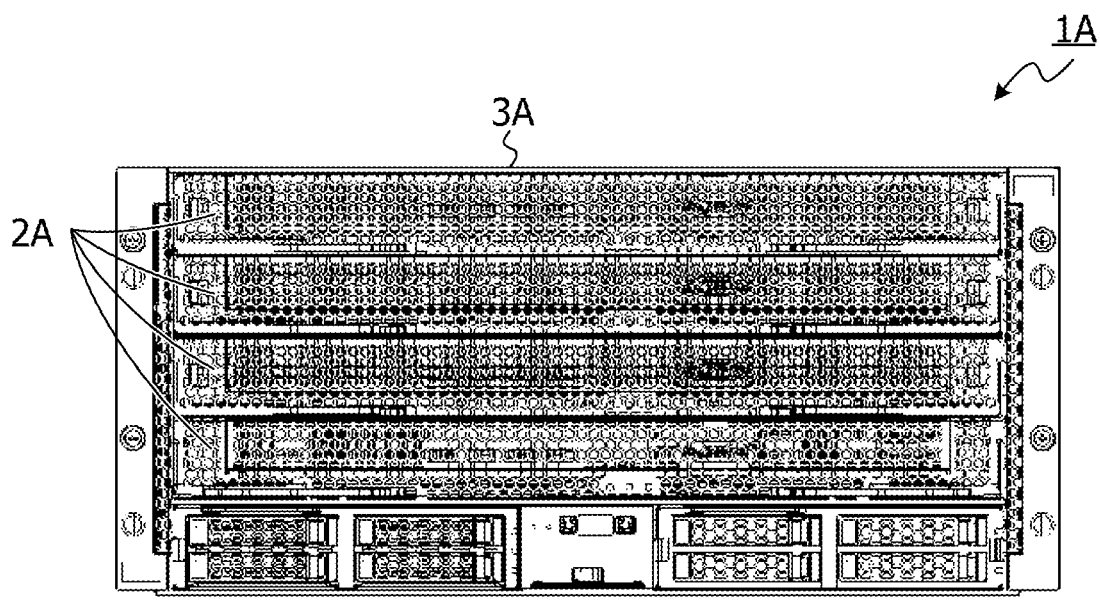
FIG. 5 illustrates an external appearance of the front of the information processing apparatus according to the implementation example.
Figure 6:
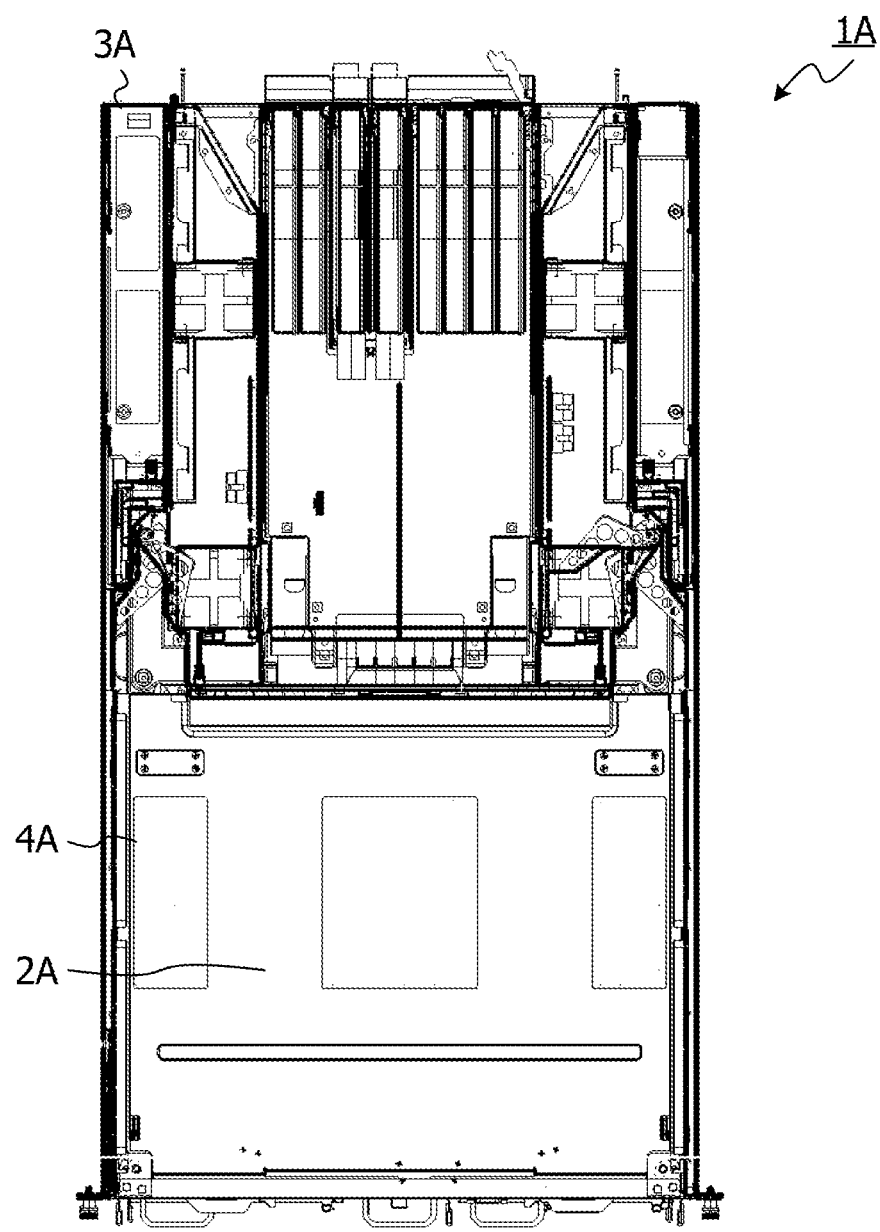
FIG. 6 illustrates an internal structure of the information processing apparatus according to the implementation example from the upper side.

FIG. 4 is a perspective view that illustrates an information processing apparatus 1A according to an implementation example. FIG. 5 illustrates an external appearance of the front of the information processing apparatus 1A according to the implementation example. FIG. 6 illustrates an internal structure of the information processing apparatus 1A according to the implementation example from the upper side. The information processing apparatus 1A is an apparatus where front units 2A may be inserted and extracted and includes a housing 3A with a plurality of slots 4A where the front units 2A are inserted and extracted.

Figure 7:
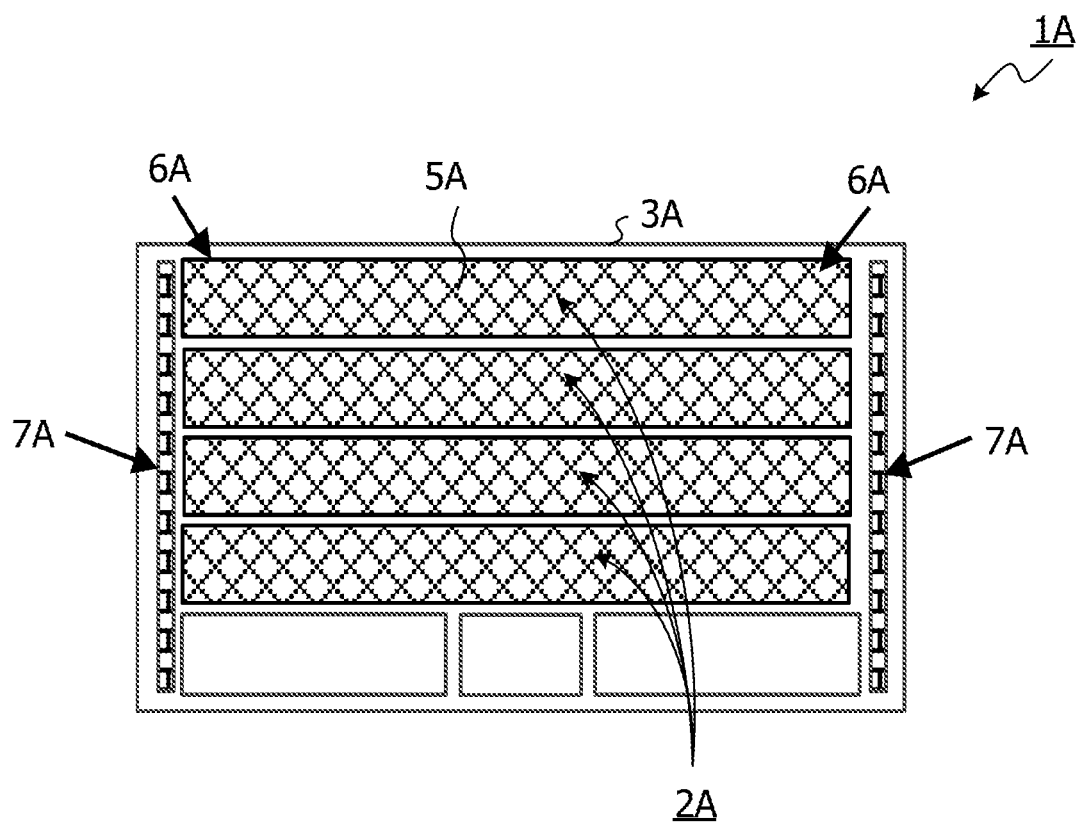
FIG. 7 illustrates a simplified external appearance of the front of the information processing apparatus.
Figure 8:
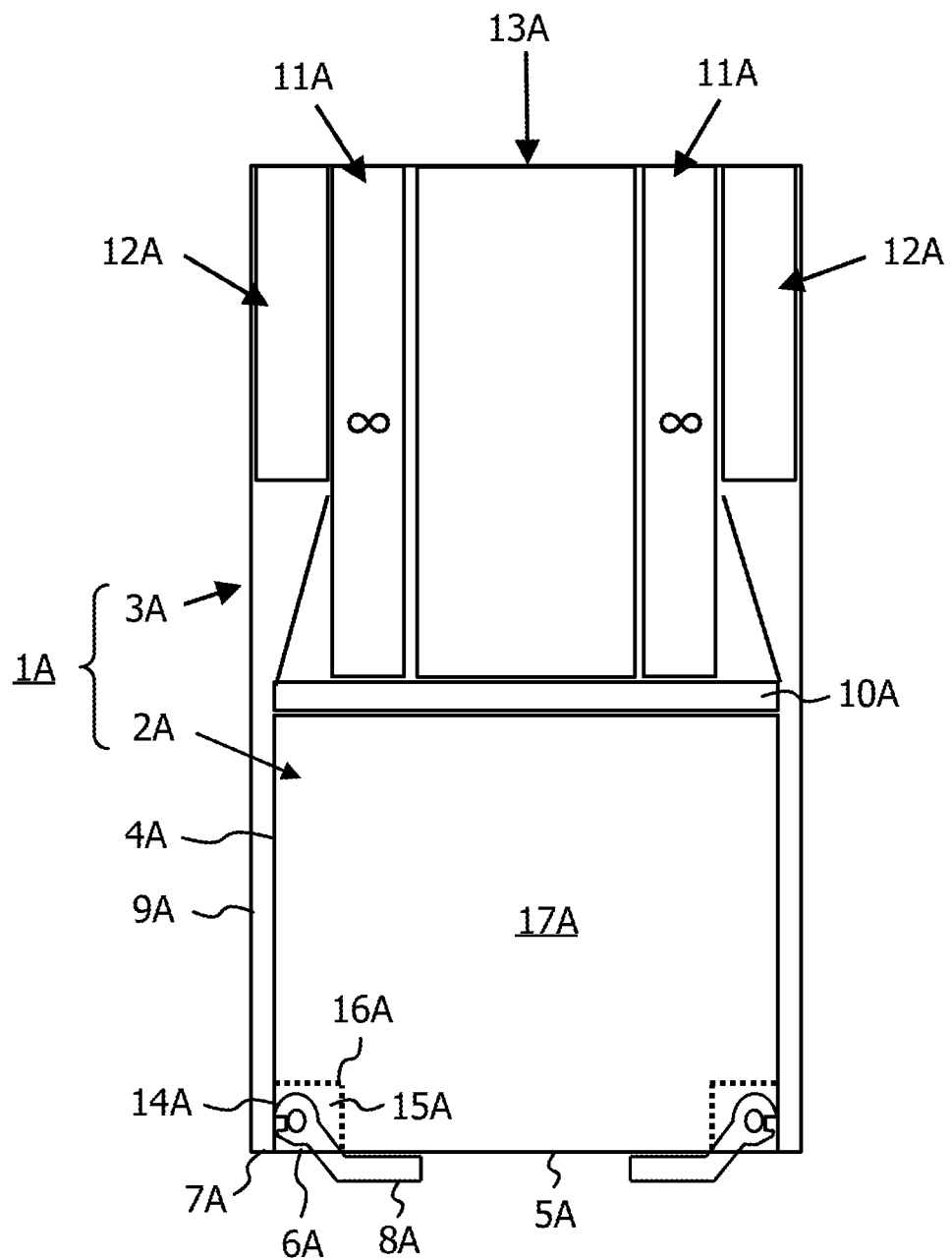
FIG. 8 illustrates a simplified internal structure of the information processing apparatus from the upper side.

FIG. 7 illustrates a simplified external appearance of the front of the information processing apparatus 1A. FIG. 8 illustrates a simplified internal structure of the information processing apparatus 1A from the upper side. Behind the slot 4A, a mid-plane 10A, where terminals of the front unit 2A are fitted, power supply units 12A, which supply power to the front unit 2A, a rear unit 13A, which governs computation processing of various kinds together with the front unit 2A, and fan units 11A, which cause cooling wind for cooling the front unit 2A and the rear unit 13A, are arranged.

In the front unit 2A, engaging mechanisms 14A that engage with projections in the slot 4A of the housing 3A are arranged in both corners in the front of the front unit 2A. The engaging mechanisms 14A are stored in engaging mechanism storing spaces 15A. The engaging mechanism 14A includes an eject lever 8A that projects further forward than the front unit 2A from the engaging mechanism storing space 15A. The engaging mechanism storing space 15A is a space partitioned from an electronic component storing space 17A by a partition 16A.

Similar to the front unit 2, in the front of each front unit 2A, an air inlet 5A for the front unit and dedicated air inlets 6A for the power supply units are formed. Also in both side portions of the slot 4A in the front of the housing 3A, housing side air inlets 7A are formed. In the front unit 2A, dedicated air inlet ducts 9A for the power supply units are arranged.

Figure 9:
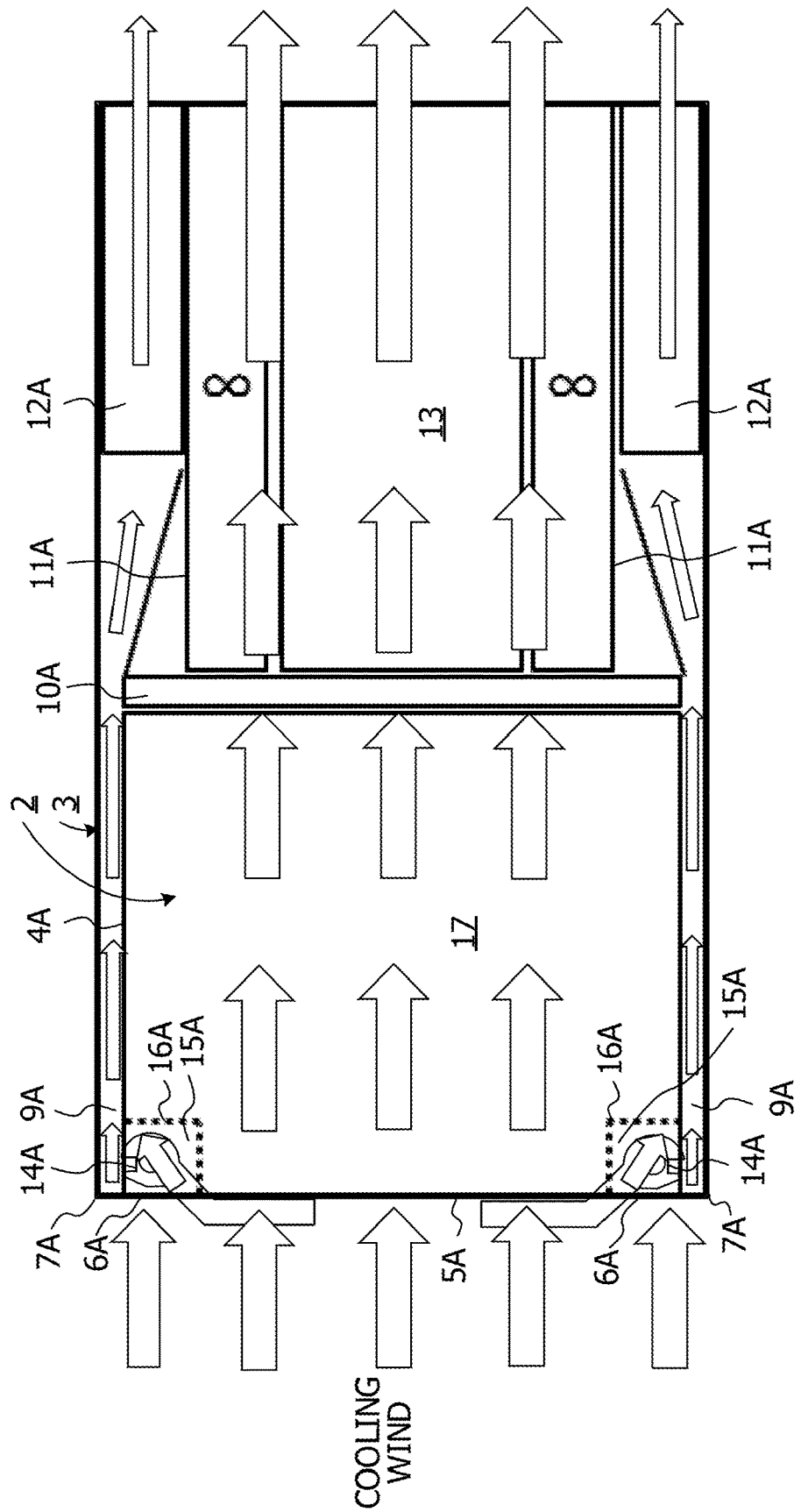
FIG. 9 illustrates flow of cooling wind in the information processing apparatus.

FIG. 9 illustrates flow of cooling wind in the information processing apparatus 1A. When the fan units 11A arranged behind the slot 4A operate, air is taken in from the air inlet 5A for the front unit and passes through the electronic component storing space 17A to escape from the rear of the housing 3A through the rear unit 13A. The air that is taken in from the housing side air inlets 7A as the fans of the power supply units 12A operate merges with the air that is taken in from the dedicated air inlets 6A for the power supply units and that passes through the engaging mechanism storing space 15A in the dedicated air inlet duct 9A for the power supply unit, and then flows to the power supply units 12A. That is, the air that is taken in from the dedicated air inlets 6A for the power supply units and the housing side air inlets 7A bypasses the front unit 2A and flows directly to the power supply units 12A. As a result, air lower in temperature and fresher than the air that passes through the electronic component storing space 17A (fresh air) flows to the power supply units 12A.

Figure 10:
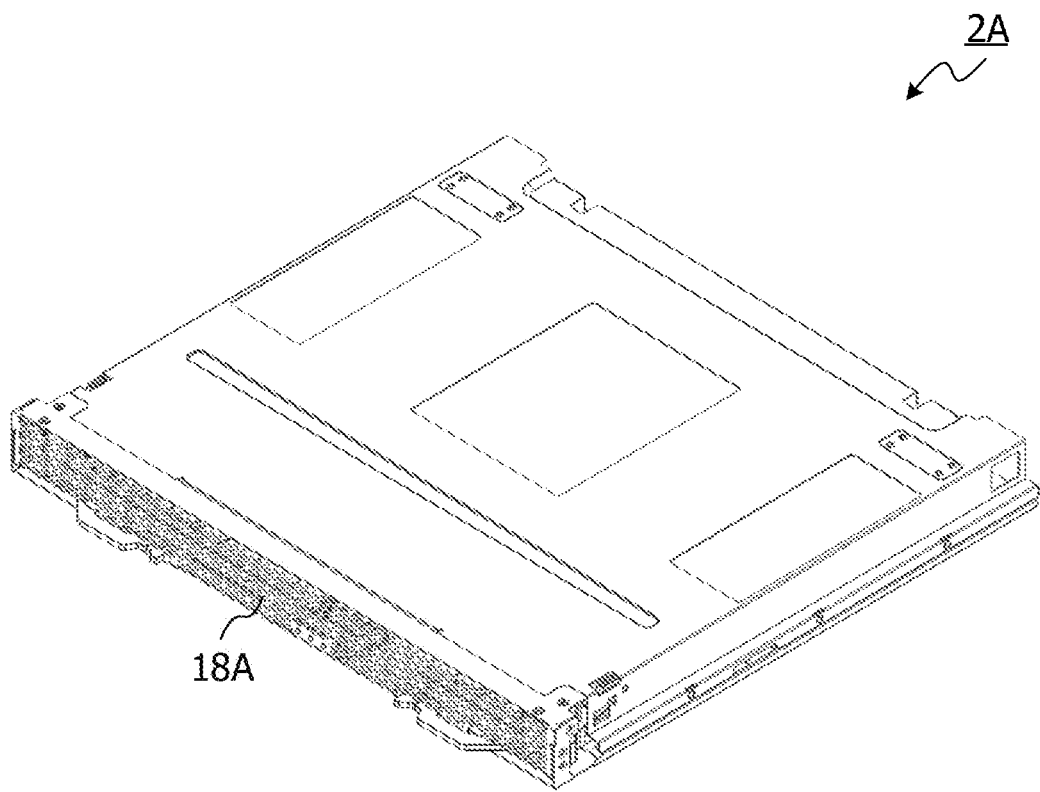
FIG. 10 is a perspective view of a front unit.
Figure 11:
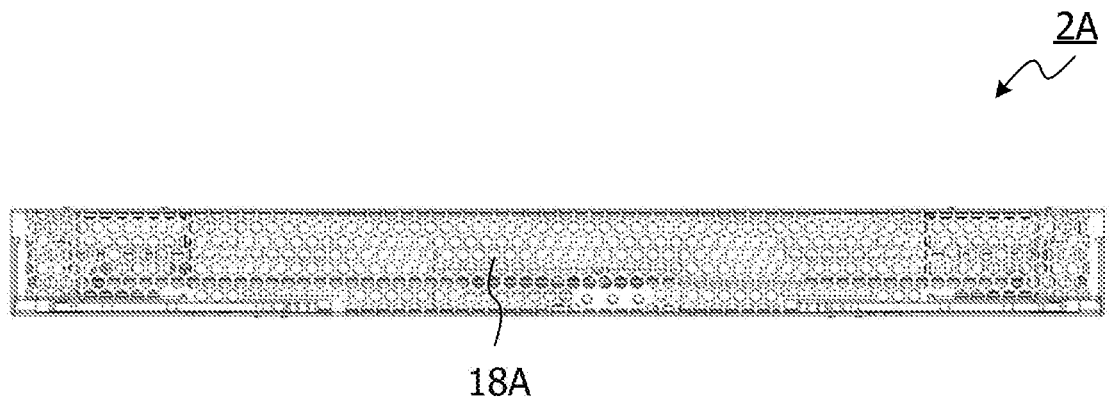
FIG. 11 illustrates the front of the front unit.

FIG. 10 is a perspective view of the front unit 2A. FIG. 11 illustrates the front of the front unit 2A. As illustrated in FIGS. 10 and 11, the front face of the front unit 2A is covered with a punched metal 18A, which is an example of a "mesh for fire protection" as used in the present application. The punched metal 18A is a member that is arranged for compliance with the standards according to IEC and a plate made of metal, where minute pores (holes of 5 mm or smaller in size) that exert ventilation performance and fire protection performance are formed in rows and columns. The aperture ratio of the punched metal 18A depends on the shape and size of a minute pore and is approximately 50% at the maximum. Thus, when the punched metal 18A described above covers an air inlet of cooling wind, compared to a case where the punched metal 18A is omitted, the effective air inlet area is largely decreased. Thus, in the present information processing apparatus 1A according to the implementation example, by forming the dedicated air inlets 6A for the power supply units so as to make up for a shortage of the air inlet area of each housing side air inlet 7A covered with a punched metal similar to the punched metal 18A described above, the largest possible volume of cooling wind in the dedicated air inlet ducts 9A for the power supply units is ensured.

Figure 12:
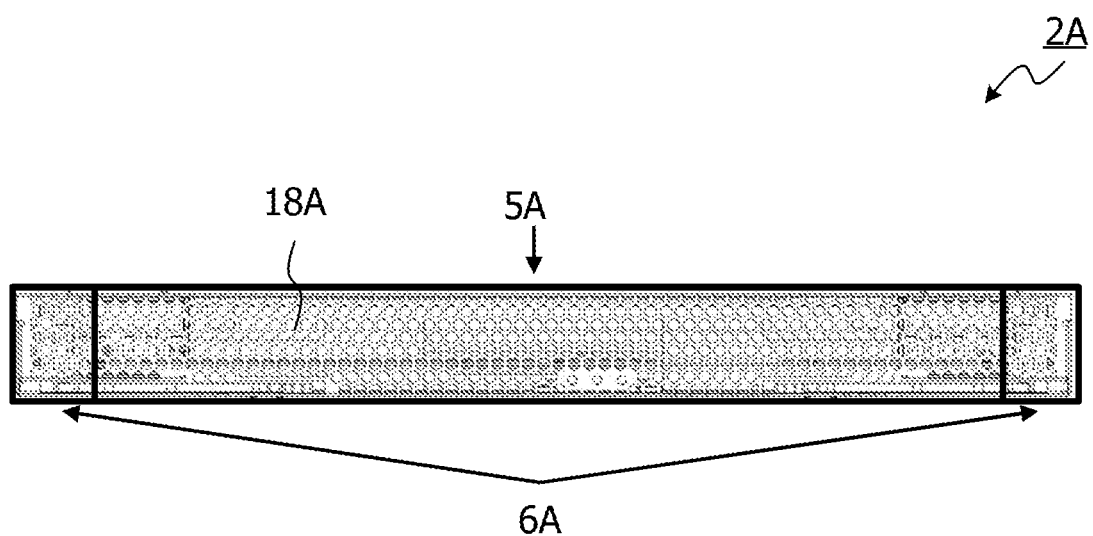
FIG. 12 illustrates allocation of an air inlet region allocated to a punched metal.

FIG. 12 illustrates allocation of an air inlet region allocated to the punched metal 18A. In the information processing apparatus 1A according to the implementation example, each housing side air inlet 7A is covered with a punched metal similar to the punched metal 18A and although the effective air inlet area of the housing side air inlet 7A is smaller than the cross-sectional area of the passage of the dedicated air inlet duct 9A for the power supply unit, a portion that functions as an air inlet of the dedicated air inlet duct 9A for the power supply unit is constituted of not only the housing side air inlet 7A but also the dedicated air inlet 6A for the power supply unit and thus, in the information processing apparatus 1A, an air inlet area equivalent to the cross-sectional area of the passage of the dedicated air inlet duct 9A for the power supply unit is ensured by the housing side air inlet 7A and the dedicated air inlets 6A for the power supply unit.

Figure 13:
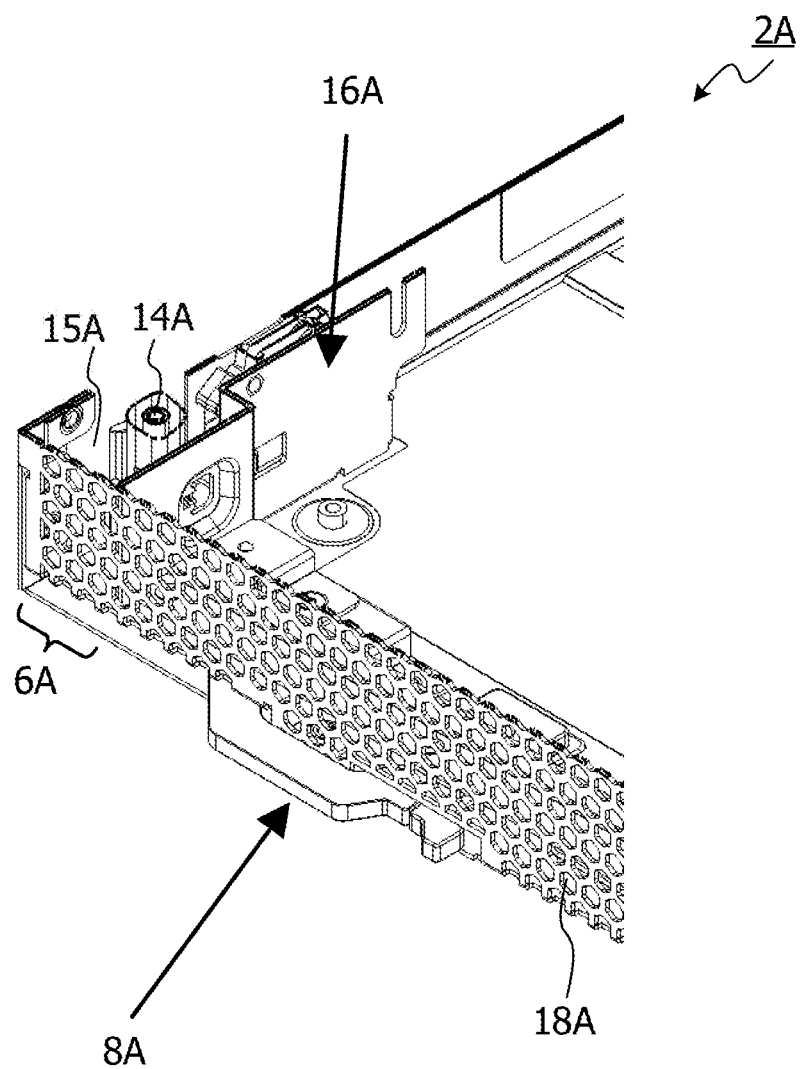
FIG. 13 is a first diagram that illustrates an internal structure of a dedicated air inlet for a power supply unit.
Figure 14:
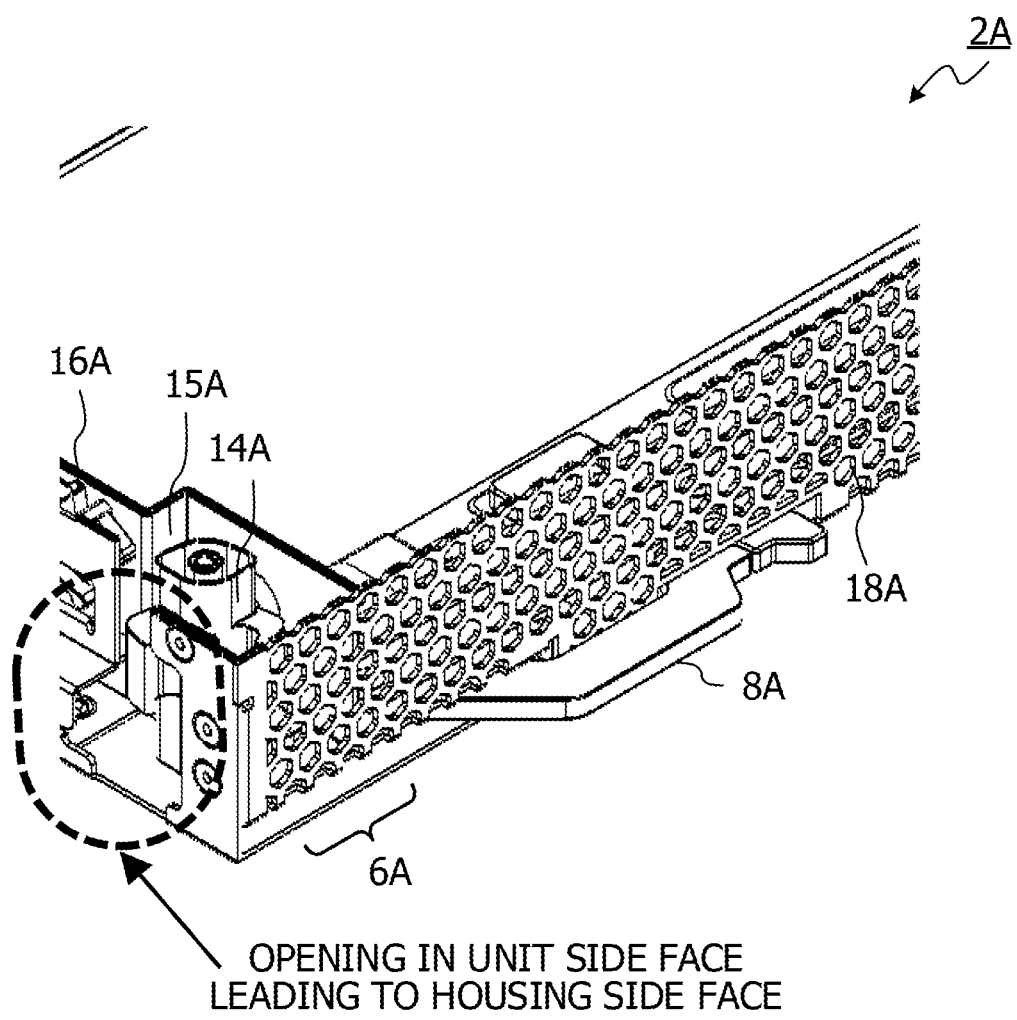
FIG. 14 is a second diagram that illustrates an internal structure of the dedicated air inlet for the power supply unit.

FIG. 13 is a first diagram that illustrates an internal structure of the dedicated air inlet 6A for the power supply unit. FIG. 14 is a second diagram that illustrates an internal structure of the dedicated air inlet 6A for the power supply unit. The inside of the dedicated air inlet 6A for the power supply unit is partitioned from the electronic component storing space 17A by the partition 16A. An opening in a side face of the front unit 2A, which is prepared for forming an engagement portion between the engaging mechanism 14A that engages with the projection in the slot 4A and the projection, forms a passage that leads from the dedicated air inlet 6A for the power supply unit to the dedicated air inlet duct 9A for the power supply unit.

Figure 15:
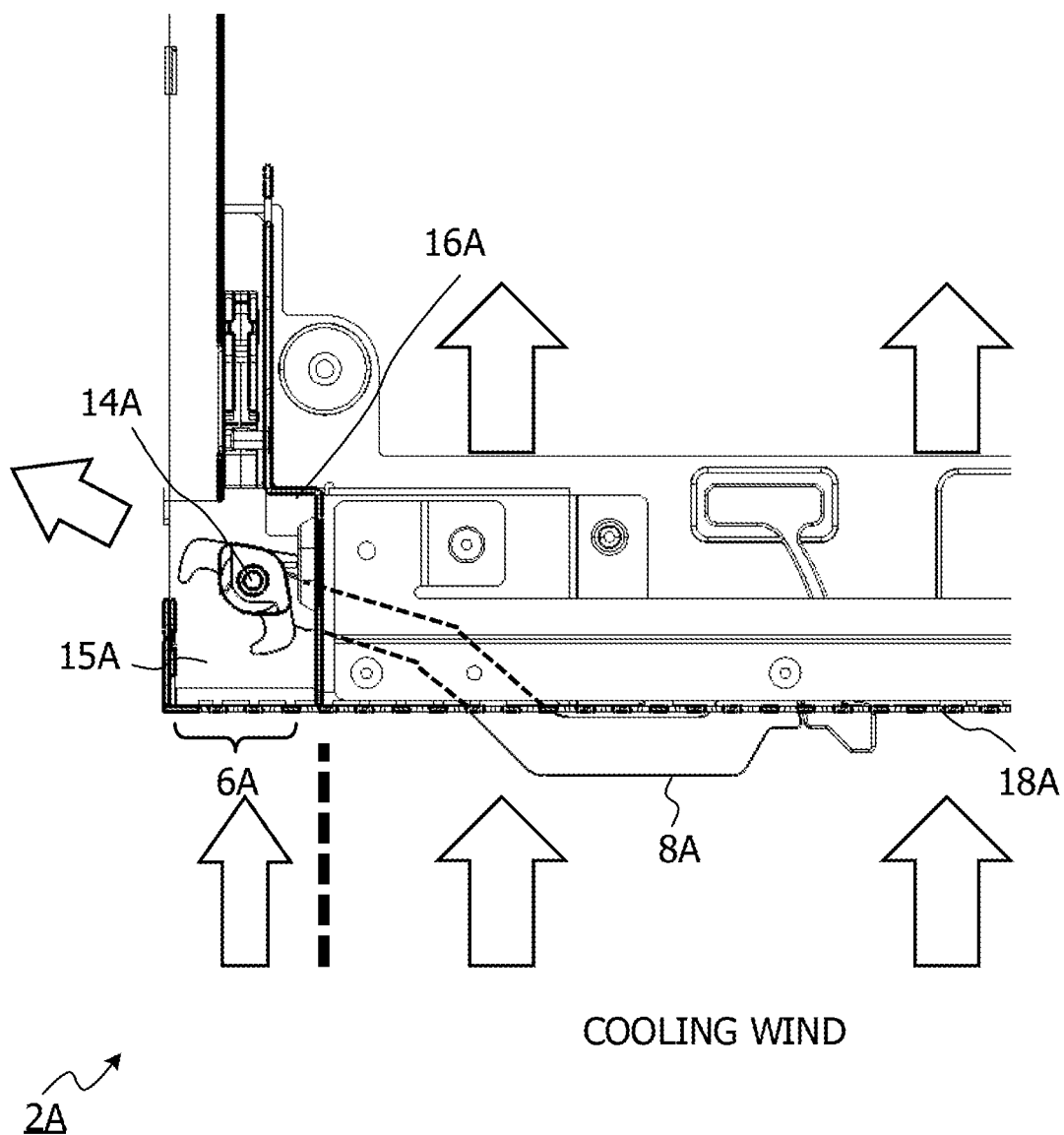
FIG. 15 illustrates flow of cooling wind in a front portion of the front unit.

FIG. 15 illustrates flow of cooling wind in a front portion of the front unit 2A. The cooling wind that passes through the air inlet 5A for the front unit flows through the electronic component storing space 17A. The cooling wind that passes through the dedicated air inlet 6A for the power supply unit flows out from the opening in the side face of the front unit 2A through the engaging mechanism storing space 15A.

Figure 16:
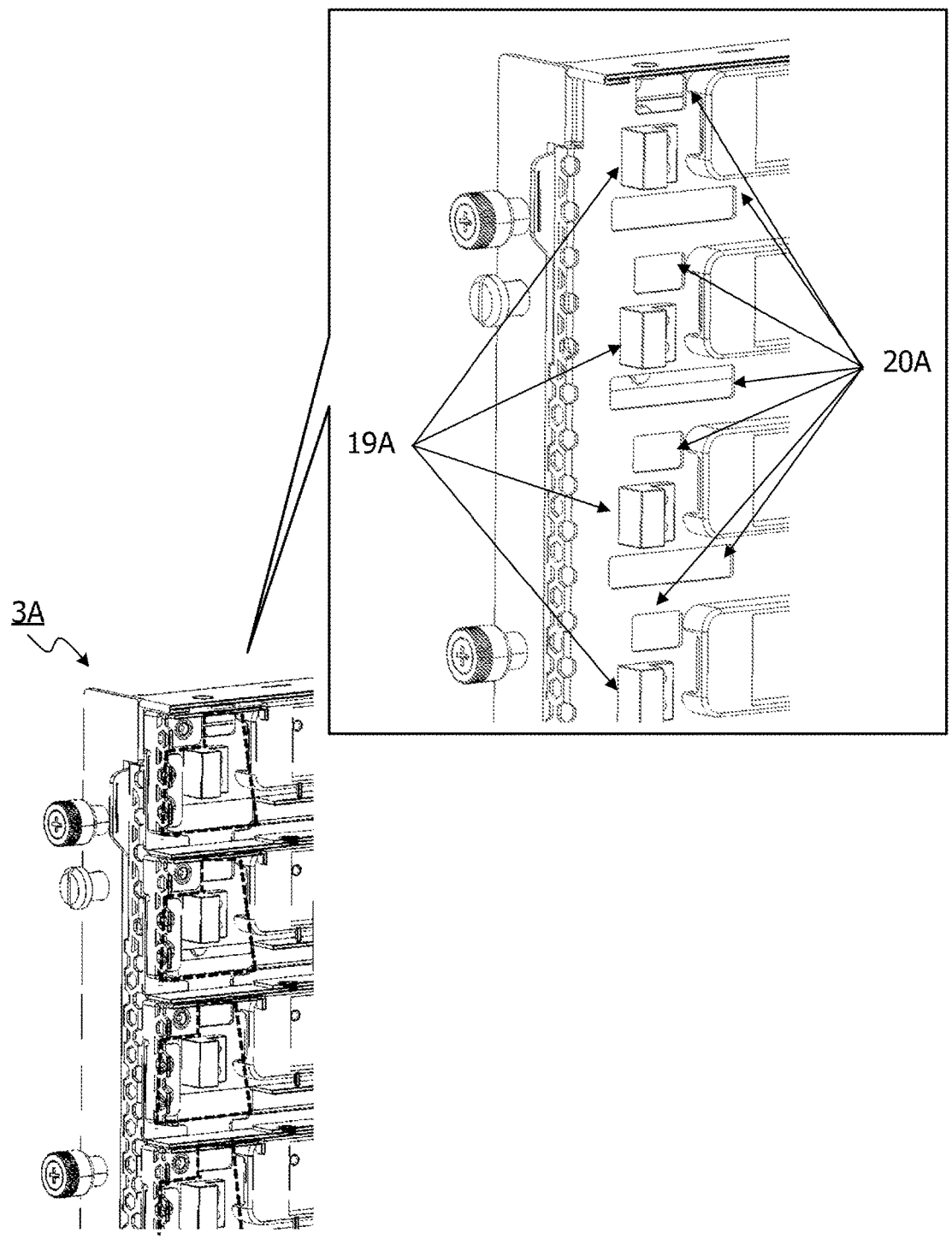
FIG. 16 illustrates the vicinity of a housing side air inlet of a housing so that the inside of a slot may be seen.

FIG. 16 illustrates the vicinity of the housing side air inlet 7A of the housing 3A so that the inside of the slot 4A may be seen. In the vicinity of opening portions of the slots 4A, projections 19A in which the engaging mechanisms 14A of the front units 2A are engaged are formed. In the vicinity of the projections 19A, intra-slot openings 20A that are open into the dedicated air inlet ducts 9A for the power supply unit is arranged. Each intra-slot opening 20A is formed in a portion that corresponds to an opening prepared in a side face of the front unit 2A for forming the engagement portion between the engaging mechanism 14A and the projection 19A, which is a portion indicated by the broken line in FIG. 16. Thus, when the front unit 2A is inserted in the slot 4A, the engaging mechanism storing space 15A enters a state where the engaging mechanism storing space 15A and the dedicated air inlet 6A for the power supply unit communicate. Consequently, the cooling wind that passes through the dedicated air inlet 6A for the power supply unit and then through the engaging mechanism storing space 15A to flow out from the opening in the side face of the front unit 2A may flow into the dedicated air inlet duct 9A for the power supply unit through the intra-slot opening 20A.

Figure 17:
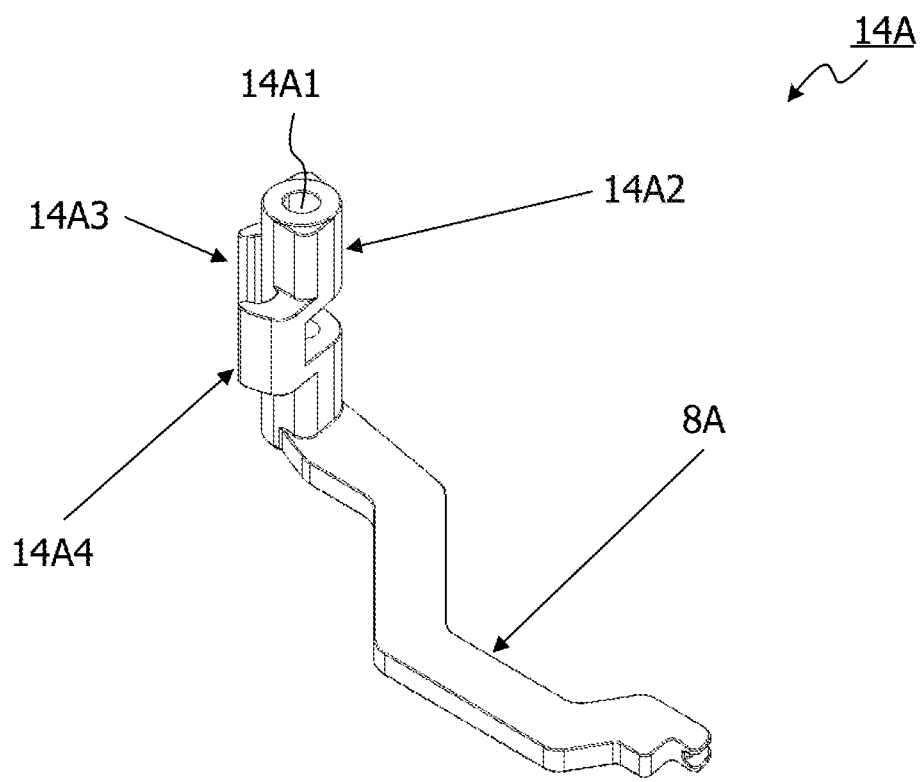
FIG. 17 illustrates an engaging mechanism.

FIG. 17 illustrates the engaging mechanism 14A. The engaging mechanism 14A is structured so that a unit insertion claw 14A3 and a unit extraction claw 14A4 project from the outer peripheral face of a shaft 14A2 including a hole 14A1 into which a rotation shaft fixed to the front unit 2A is inserted. When the eject lever 8A arranged at the lower end of the shaft 14A2 is operated, the engaging mechanism 14A may rotate about the rotation shaft that is inserted in the hole 14A1. It is desirable that the engaging mechanism 14A and the eject lever 8A have each a position, shape, and size that cause no hindrance to a passage of cooling wind. For example, it is desirable for the engaging mechanism 14A to be located further behind than the intra-slot opening 20A so as not to be a hindrance to a passage of cooling wind. For example, it is desirable for the eject lever 8A to be formed of a thin plate so as not to be a hindrance to a passage of cooling wind.

Figure 18:
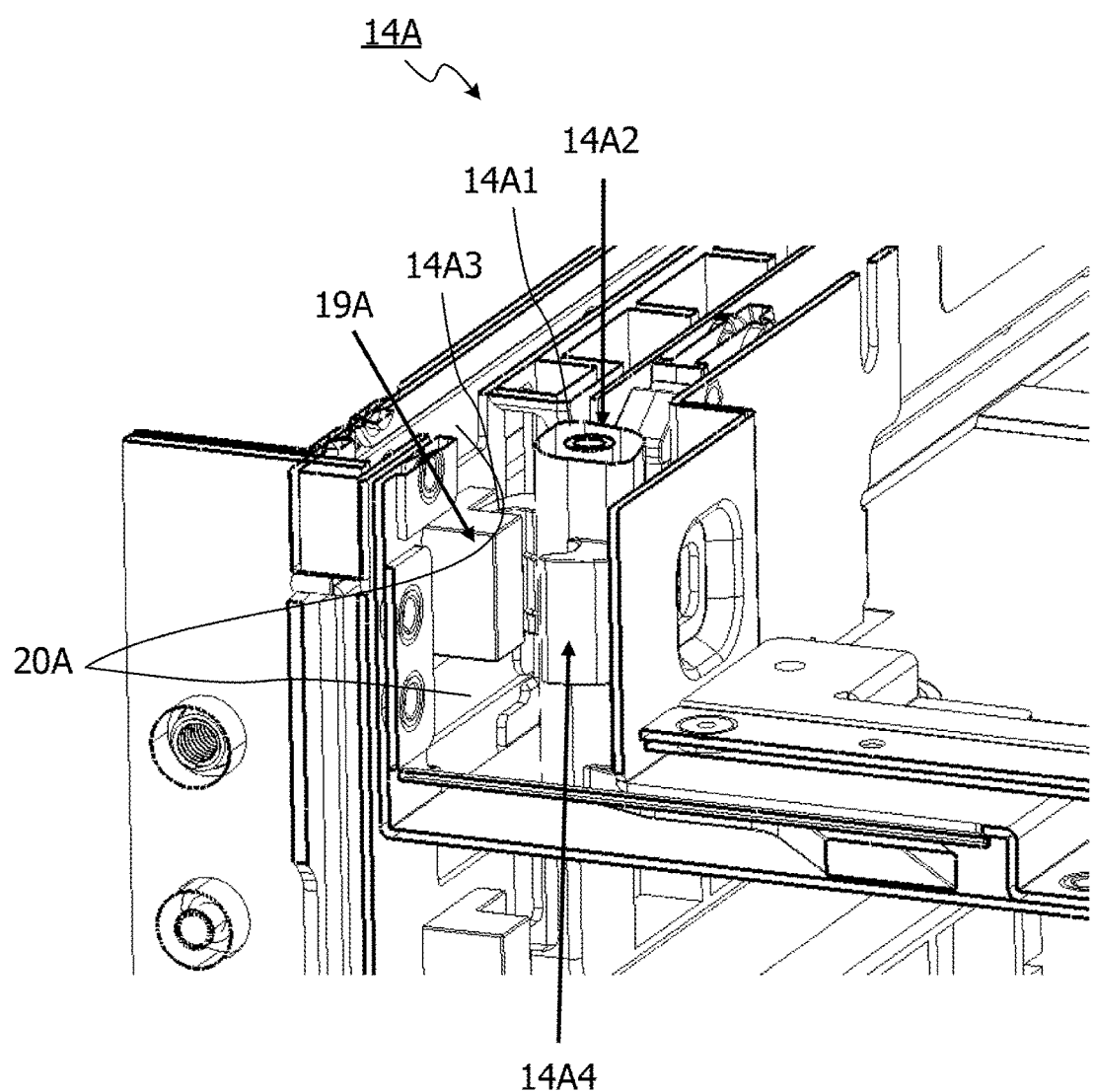
FIG. 18 illustrates an engagement state between the engaging mechanism and a projection.

FIG. 18 illustrates an engagement state between the engaging mechanism 14A and the projection 19A. When the eject lever 8A is pushed toward the front unit 2A in a state where the front unit 2A is inserted in the slot 4A, the unit insertion claw 14A3 comes into contact with the projection 19A and the front unit 2A enters a state of being fixed in the slot 4A. As demonstrated in FIG. 18, the intra-slot openings 20A are formed on the upper side and the lower side of the projection 19A and thus, even when the engaging mechanism 14A is in a state of engaging with the projection 19A, a passage of cooling wind that passes through the engaging mechanism storing space 15A is ensured.

Figure 19:
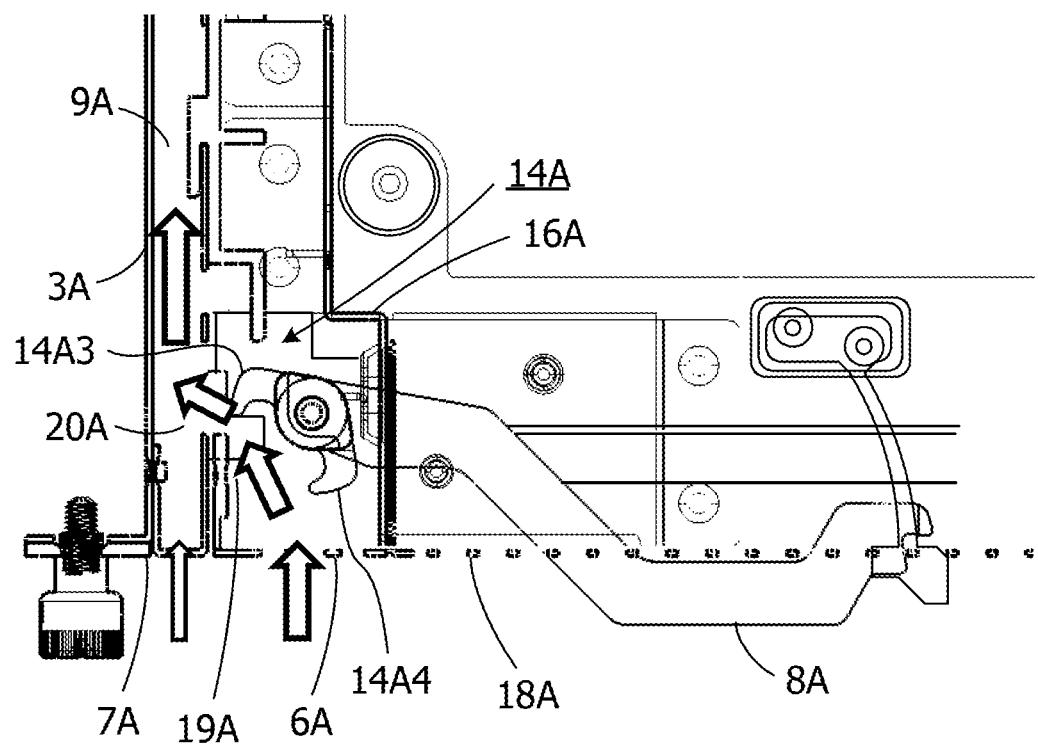
FIG. 19 illustrates flow of cooling wind that flows to a dedicated air inlet duct for the power supply unit.

FIG. 19 illustrates flow of cooling wind that flows to the dedicated air inlet duct 9A for the power supply unit. Since the engaging mechanism 14A in the engaging mechanism storing space 15A is structured as described above, cooling wind that flows into the engaging mechanism storing space 15A from the dedicated air inlet 6A for the power supply unit flows out from the engaging mechanism storing space 15A and passes through the intra-slot opening 20A to flow into the dedicated air inlet duct 9A for the power supply unit. As a result, in the dedicated air inlet duct 9A for the power supply unit, the cooling wind that passes through the dedicated air inlet 6A for the power supply unit merges with the cooling wind that passes through the housing side air inlet 7A. Consequently, in the information processing apparatus 1A according to the present implementation example, a sufficient amount of cooling wind that cools the power supply units 12A passes through the dedicated air inlet ducts 9A for the power supply units and the power supply units 12A are effectively cooled.

Figure 20:
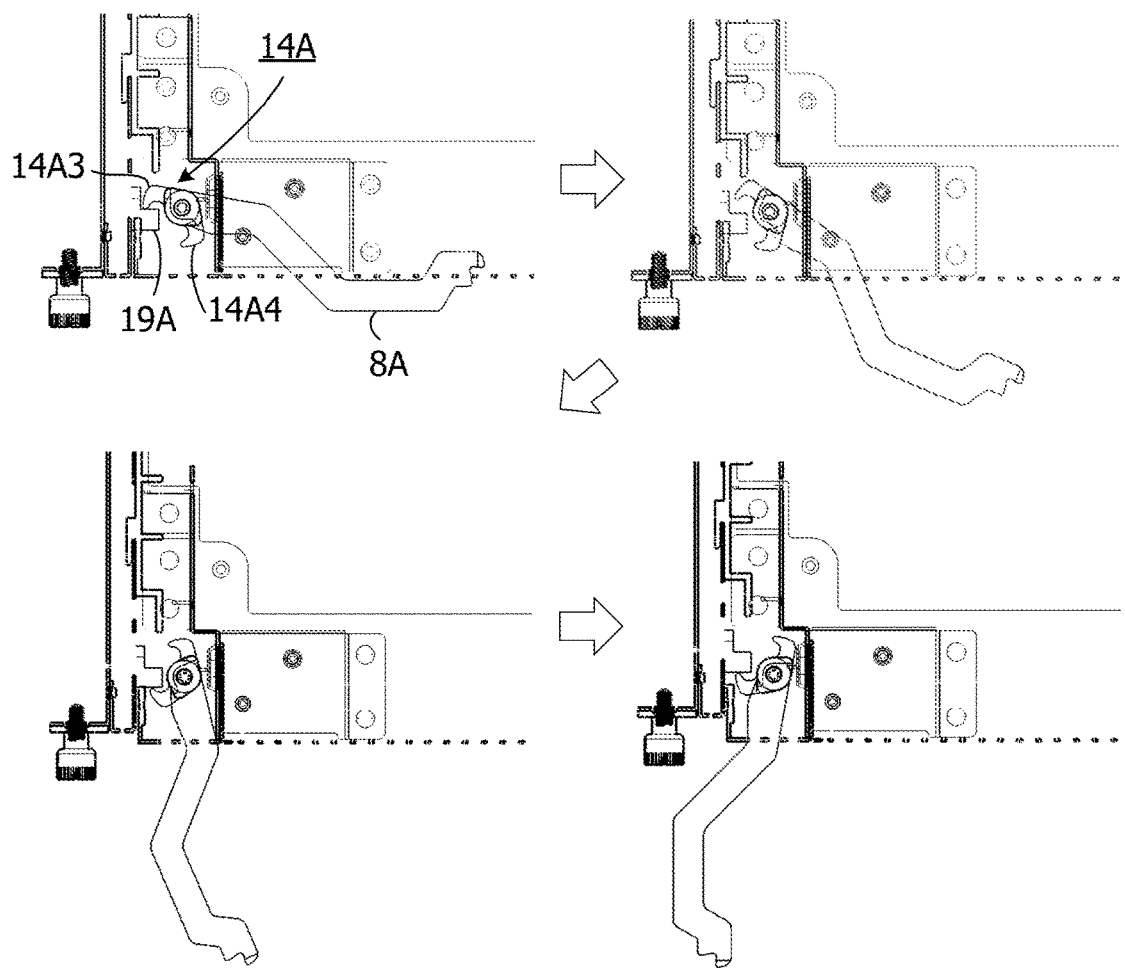
FIG. 20 illustrates operation of an eject lever.

The front unit 2A is extracted as described below. FIG. 20 illustrates operation of the eject lever 8A. When for example, the front unit 2A is extracted from the slot 4A, the eject lever 8A is pulled further forward than the front unit 2A. When the eject lever 8A is pulled further forward than the front unit 2A, the unit extraction claw 14A4 comes into contact with the projection 19A. Then, the front unit 2A is pushed forward by the principle of the lever, where an end of the eject lever 8A serves as the point to which force is applied, a contact portion of the unit extraction claw 14A4 with the projection 19A serves as the fulcrum, and the rotation shaft inserted in the hole 14A1 serves as the point of action.

An implementation example prepared for verifying advantages of the information processing apparatus 1 is described above. Comparative examples prepared for the verification are described next.

First Comparative Example

Figure 21:
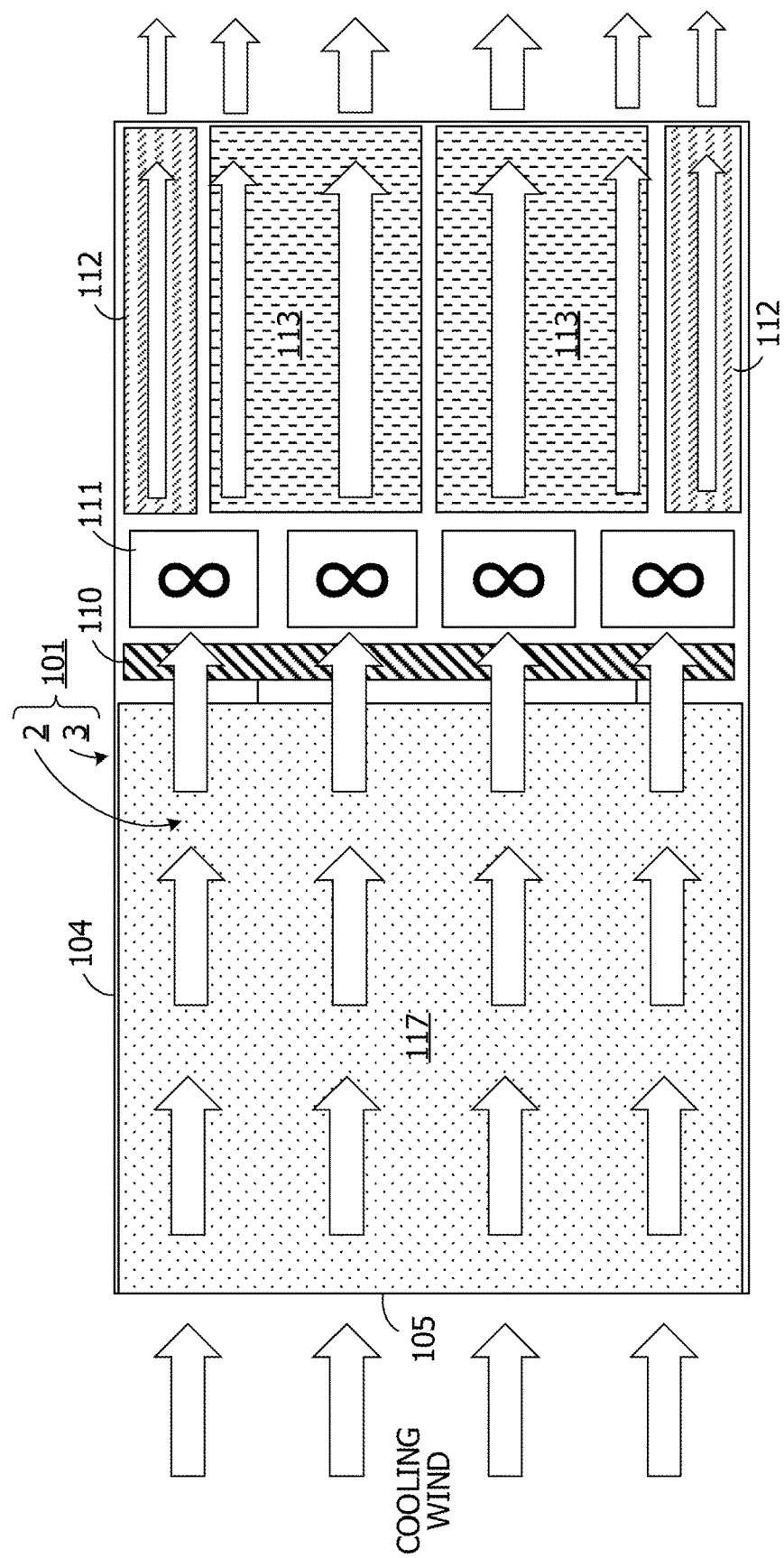
FIG. 21 illustrates flow of cooling wind in an information processing apparatus according to a first comparative example.

FIG. 21 illustrates flow of cooling wind in an information processing apparatus 101 according to a first comparative example. Similar to the information processing apparatus 1 and the information processing apparatus 1A, the information processing apparatus 101 is an apparatus where front units 102 may be inserted and extracted. That is, the information processing apparatus 101 includes a housing 103 with a plurality of slots 104 where the front units 102 are inserted and extracted. Behind the slot 104, a mid-plane 110, where terminals of the front unit 102 are fitted, power supply units 112, which supply power to the front unit 102, and rear units 113, which govern computation processing of various kinds together with the front unit 102, are arranged.

In the information processing apparatus 101, when fan units 111 arranged behind the slots 104 operate, air is taken in from an air inlet 105 for the front unit and passes through an electronic component storing space 117 to escape from the rear of the housing 103 through the rear units 113 and the power supply units 112. That is, air with a temperature that increases as the air passes through the electronic component storing space 117 flows to the power supply units 112.

Second Comparative Example

Figure 22:
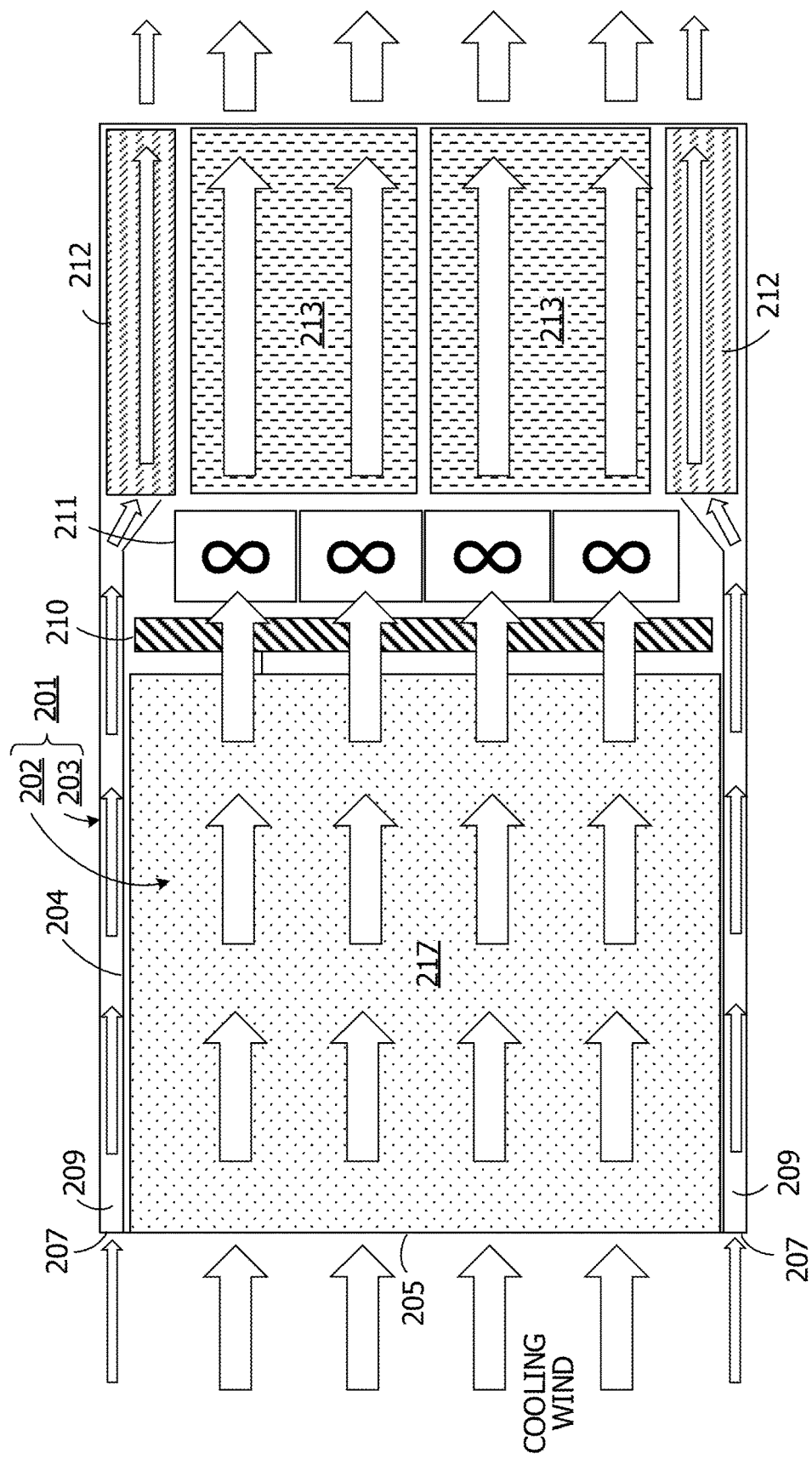
FIG. 22 illustrates flow of cooling wind in an information processing apparatus according to a second comparative example.

FIG. 22 illustrates flow of cooling wind in an information processing apparatus 201 according to a second comparative example. Similar to the information processing apparatus 1 and the information processing apparatus 1A, the information processing apparatus 201 is an apparatus where front units 202 may be inserted and extracted. That is, the information processing apparatus 201 includes a housing 203 with a plurality of slots 204 where the front units 202 are inserted and extracted. Behind the slot 204, a mid-plane 210, where terminals of the front unit 202 are fitted, power supply units 212, which supply power to the front unit 202, and rear units 213, which govern computation processing of various kinds together with the front unit 202, are arranged. In both side portions of the slot 204 in the housing 203, dedicated air inlet ducts 209 for the power supply units are formed, which extend along an insertion and extraction direction in which the front unit 202 is inserted into and extracted from the slot 204. Housing side air inlets 207, which form opening portions on the upstream sides of the dedicated air inlet ducts 209 for the power supply units, and an air inlet 205 for the front unit, which forms an air inlet of cooling wind that flows into an electronic component storing space 217, are covered with a mesh for fire protection so as to comply with various standards demanded on the information processing apparatus 201, such as those according to IEC.

In the information processing apparatus 201, when fan units 211 arranged behind the slot 204 operate, air is taken in from the air inlet 205 for the front unit and passes through the electronic component storing space 217 to escape from the rear of the housing 203 through the rear units 213. The air that is taken in from the housing side air inlets 207 as fans of the power supply units 212 operate flows to the power supply units 212 through the dedicated air inlet ducts 9 for the power supply units. That is, the air that is taken in from the housing side air inlets 207 bypasses the front unit 202 and flows directly to the power supply units 212. As a result, air lower in temperature and fresher than the air that passes through the electronic component storing space 217 (fresh air) flows to the power supply units 212. However, since the housing side air inlets 207 are covered with the mesh for fire protection, cooling wind of an amount appropriate to the cross-sectional area of a passage of each dedicated air inlet duct 209 for the power supply unit does not flow to the dedicated air inlet duct 209 for the power supply unit.

Figure 24:
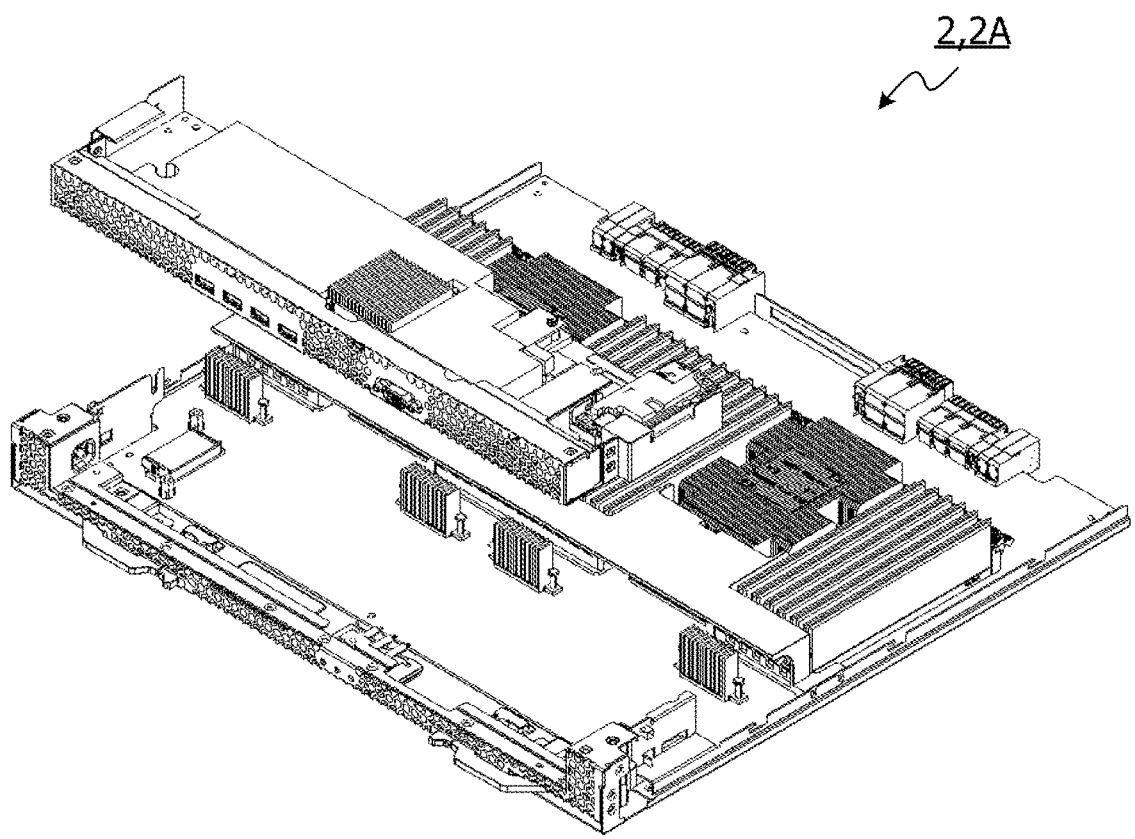
FIG. 24 illustrates a variation of the front unit.

FIG. 23 illustrates air inlets formed by the dedicated air inlets 6A for the power supply units and the housing side air inlets 7A according to the implementation example and passages on the upstream side thereof. For example, as illustrated in FIG. 23, it is assumed that each cross-sectional area of dedicated air inlet ducts for the power supply unit, which correspond to the dedicated air inlet ducts 9, 9A, and 209 for the power supply units, is 1610 mm². It is also assumed that the aperture ratio of a mesh (a punched metal) that covers the air inlets is 28%. When for example, the dedicated air inlet of the air inlet duct is constituted only of the housing side air inlets 207, which are almost identical in size to the cross-sectional area of the air inlet ducts as in the information processing apparatus 201, the effective air inlet area of the housing side air inlets 207 is 460 mm². When the air inlet of the air inlet duct is constituted of the two dedicated air inlets 6A for the power supply units in addition to the housing side air inlets 7A as in the information processing apparatus 1A, the effective air inlet area of the air inlet duct may be 1610 mm² for example, which is approximately 3.5 times as large as that according to the information processing apparatus 201. Comparison results of the aperture areas and the aperture ratios are indicated in a table below.

tronic component storing spaces 17 and 17A. FIG. 24 illustrates a variation of the front units 2 and 2A. As illustrated in FIG. 24, the front units 2 and 2A may each be for example, a type where modules installed in the respective electronic component storing spaces 17 and 17A are detachable and attachable in a state where each top plate is removed.

Figure 25:
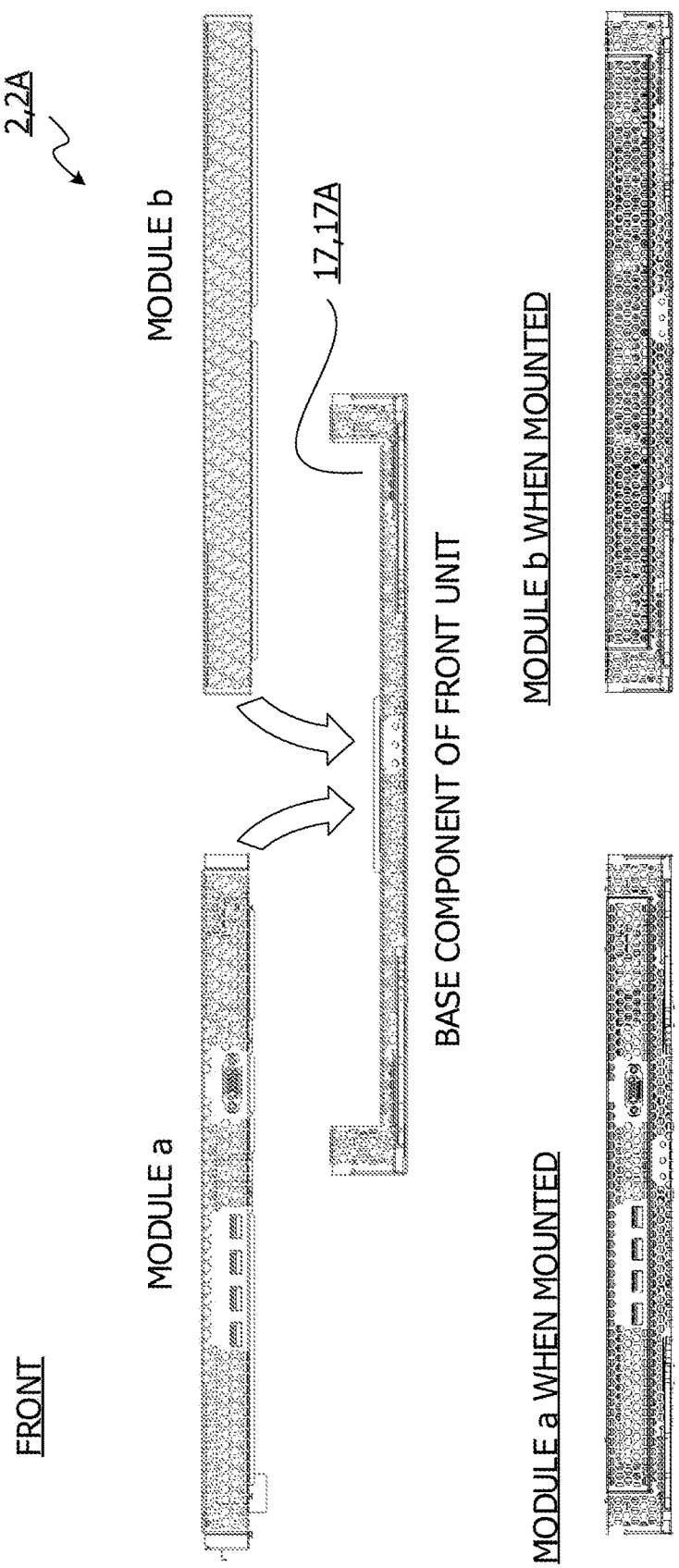
FIG. 25 illustrates how modules installed in electronic component storing spaces are replaced.

FIG. 25 illustrates how the modules installed in the electronic component storing spaces 17 and 17A are replaced. When the front units 2 and 2A are each a type where modules installed in the respective electronic component storing spaces 17 and 17A are detachable and attachable, the modules may be replaced as desired, depending on the purpose.

Figure 26:
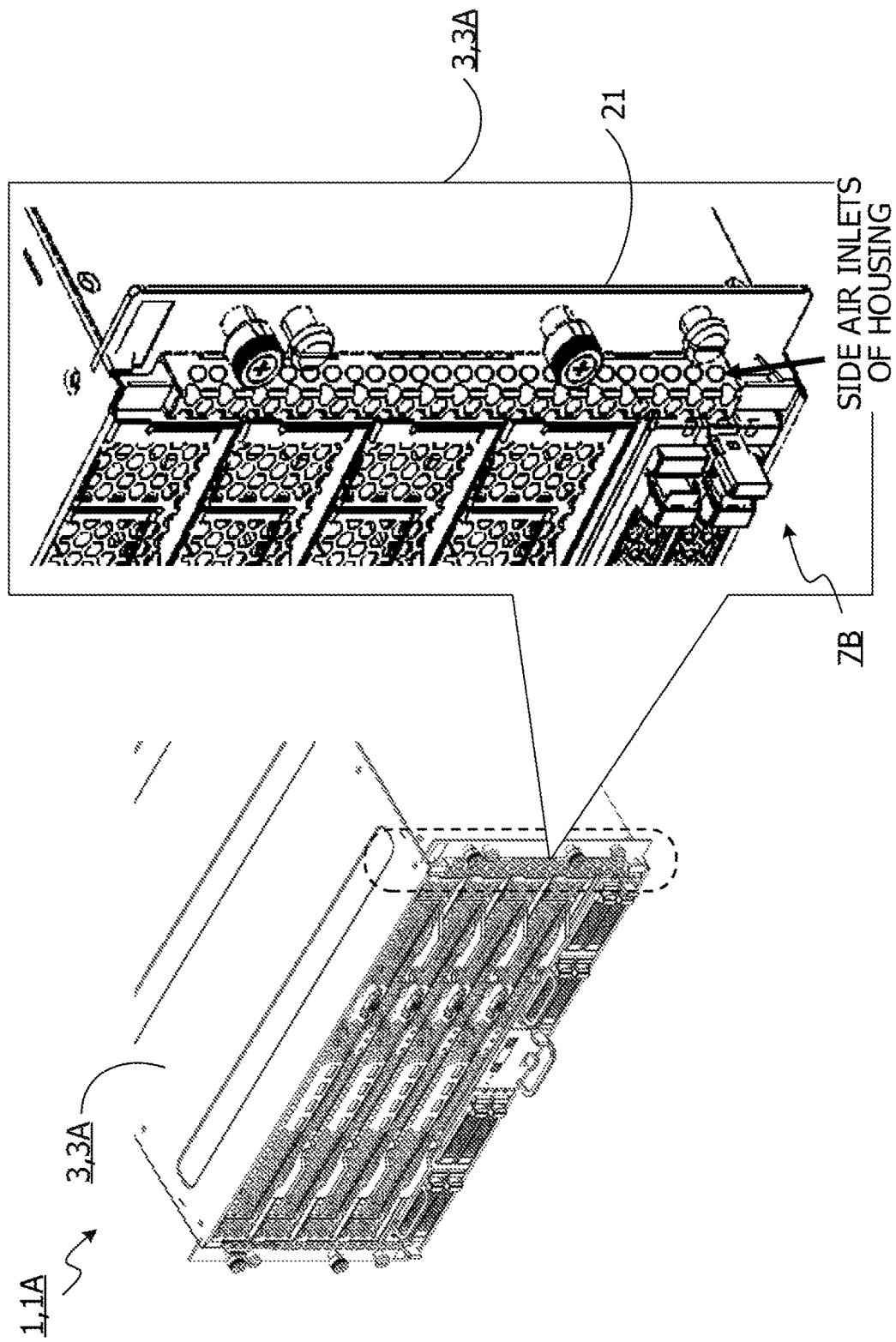
FIG. 26 illustrates a variation of the housing side air inlets.

The housing side air inlets 7 and 7A included in the information processing apparatus 1 according to the present embodiment and the information processing apparatus 1A according to the implementation example may be varied as described below for example. FIG. 26 illustrates a variation of the housing side air inlets 7 and 7A. In housing side air inlets 7B illustrated in FIG. 26, opening portions are present not only on the front side of the housings 3 or 3A but also on the left and right sides of the housings 3 or 3A. Thus, the housing side air inlets 7B according to the present variation may ensure an air inlet area larger than those of the housing side air inlets 7 and 7A. The housing side air inlets 7B

TABLE 1

| | | Cross-sectional area [mm²] of dedicated duct for power supply units | Total aperture area [mm²] | Aperture ratio [%] to cross-sectional area of dedicated duct for power supply units |
|---|---|---|---|---|
| Typical example | Housing side air inlets only | 1610 | 460 | 28% |
| Implementation example | Housing side air inlets + dedicated air inlets for power supply units on front unit side | 1610 | 460 + 295*4 = 1640 | 101% |

As demonstrated by the above-described comparison, in the information processing apparatus 1 according to the present embodiment and the information processing apparatus 1A according to the implementation example, even when opening portions are covered with meshes so as to meet various standards, such as those according to the IEC, the effective air inlet area equivalent to the cross-sectional area of the dedicated air inlet ducts 9 and 9A for the power supply units may be ensured. That is, by effectively utilizing space for engaging mechanisms, which is normally reserved in a unit type structure where insertion into and extraction from slots of a housing are performed (and may be regarded as a "dead space" in terms of the passage of cooling wind), the cooling efficiencies of the power supply units 12 and 12A may be raised and adaptation to further increase in capacity of the power supply units 12 and 12A may be enabled without enlarging the widths of the slots 4 and 4A or reducing the mounting areas for electronic components prepared for the front units 2 and 2A.

The front units 2 and 2A used in the information processing apparatus 1 according to the present embodiment and the information processing apparatus 1A according to the implementation example may each be for example, a type where a plurality of modules are installed in the respective elecaccording to the present variation may be applied to the housings 3 and 3A, where front faces of the housing 3 and 3A project further forward than fixing hardware 21 arranged at both left and right ends and even in a state where the information processing apparatuses 1 and 1A are each fixed at a mount angle by the fixing hardware 21, a left side face and a right side face of each of the housings 3 and 3A are slightly exposed further forward relative to the mount angle.

Figure 27:
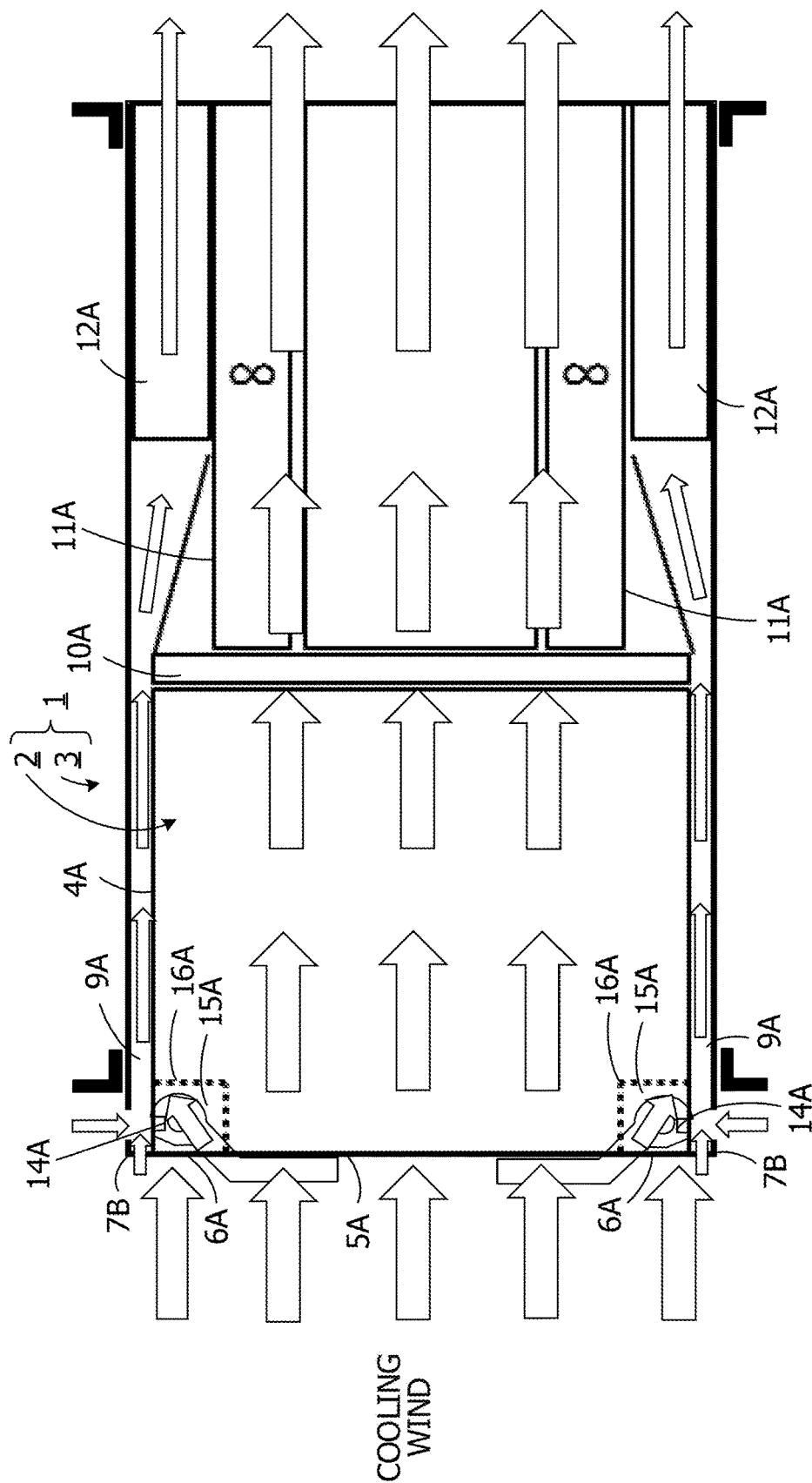
FIG. 27 illustrates flow of cooling wind in an information processing apparatus with the housing side air inlets according to the variation.

FIG. 27 illustrates flow of cooling wind in the information processing apparatus 1A with the housing side air inlets 7B according to the variation. When the fans of the power supply units 12A operate, in the housing side air inlets 7B, air flows in not only from the front side of the housing 3A but also from both left and right sides of the housing 3A. As a result, cooling wind of an amount larger than that in a case where the housing side air inlets 7A are arranged flows to the dedicated air inlet ducts 9A for the power supply units.

Although in the information processing apparatuses 1 and 1A, the respective dedicated air inlet ducts 9 and 9A for the power supply units are arranged on both sides of the slots 4 and 4A, the respective dedicated air inlet ducts 9 and 9A for the power supply units may be arranged on one side of the slots 4 and 4A.

Although the engaging mechanism storing spaces 15 and 15A in the dedicated air inlets 6 and 6A for the power supply units store the engaging mechanisms 14 and 14A that operate with the eject levers 8 and 8A, respectively, the engaging mechanisms in the dedicated air inlets 6 and 6A for the power supply units are not limited to what includes a lever. In the dedicated air inlets 6 and 6A for the power supply units, various engaging mechanisms without levers may be stored.

Although in the information processing apparatuses 1 and 1A, the dedicated air inlet ducts 9 and 9A for the power supply units are used as ducts of cooling wind for the power supply units 12 and 12A, cooling wind that passes through the dedicated air inlet ducts 9 and 9A for the power supply units may be used in cooling heat generation devices other than the power supply units 12 and 12A. Examples of such heat generation devices other than the power supply units 12 and 12A include a unit where large-scale integration (LSI) and high heat generation devices are mounted and a unit where components with rigorous ambient temperature conditions are mounted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus comprising:
a housing that includes a slot where an electronic assembly is inserted and extracted, and a power supply unit;
a first air inlet that is present in a corner in a front portion of the electronic assembly and includes a space to store an engaging mechanism that engages with the slot;
that bypasses the electronic assembly and
a fan arranged between the slot and the power supply unit,
the first air inlet communicates with the duct and, by the fan, air from the first air inlet and the second air inlet is sent to the power supply unit through the duct.

2. The information processing apparatus according to claim 1, wherein the duct is present in the housing that includes the slot.

3. The information processing apparatus according to claim 1, wherein the slot includes an opening through which the space to store the engaging mechanism and the duct communicate.

4. The information processing apparatus according to claim 1, wherein the engaging mechanism includes an operating lever.

5. The information processing apparatus according to claim 1, wherein the first and second air inlets are covered with a fire protection mesh.

6. The information processing apparatus according to claim 1, wherein the first air inlet for the electronic assembly is present in the front portion of the electronic assembly.

* * * * *